United States Patent [19]

Sugawara

[11] Patent Number: 5,698,346

[45] Date of Patent: Dec. 16, 1997

[54] PHOTOMASK-PATTERN-SHAPE EVALUATION METHOD, PHOTOMASK, PHOTOMASK MANUFACTURING METHOD, PHOTOMASK-PATTERN FORMING METHOD, AND EXPOSURE METHOD

[75] Inventor: Minoru Sugawara, Kanagawa, Japan

[73] Assignee: Sony Corporation, Tokyo, Japan

[21] Appl. No.: 593,915

[22] Filed: Jan. 30, 1996

[30] Foreign Application Priority Data

Jan. 31, 1995 [JP] Japan ............... P07-034221

[51] Int. Cl.$^6$ .................................................. G03F 9/00
[52] U.S. Cl. .................................................. 430/5; 430/22
[58] Field of Search ............... 430/5, 322, 324, 430/394, 22; 437/8

[56] References Cited

U.S. PATENT DOCUMENTS 5,424,154   6/1995   Borodovsky ................... 430/5
5,447,810   9/1995   Chen et al. ..................... 430/5

Primary Examiner—S. Rosasco
Attorney, Agent, or Firm—Hill, Steadman & Simpson

[57] ABSTRACT

A pattern-shape evaluation method for a photomask used in a photolithography process is provided in order to accurately evaluate pattern corrections performed against the optical proximity effect within mask-line-width latitude, exposure latitude, and the depth of focus. The pattern-shape evaluation method comprises the steps of: specifying a plurality of evaluation patterns to be formed on a photomask and specifying two of the three kinds of latitude; obtaining the transfer pattern corresponding to each of the evaluation patterns with a quantity related to the remaining latitude being changed as a changing quantity; obtaining the sizes of portions on the transfer pattern at the positions on the transfer pattern corresponding to a plurality of measurement points specified in advance on each of the evaluation patterns; and obtaining the minimum value of the changing quantity as the remaining latitude within the two kinds of latitude specified according to the obtained sizes of the transfer pattern and comparing the obtained latitude for each of the evaluation patterns.

8 Claims, 28 Drawing Sheets

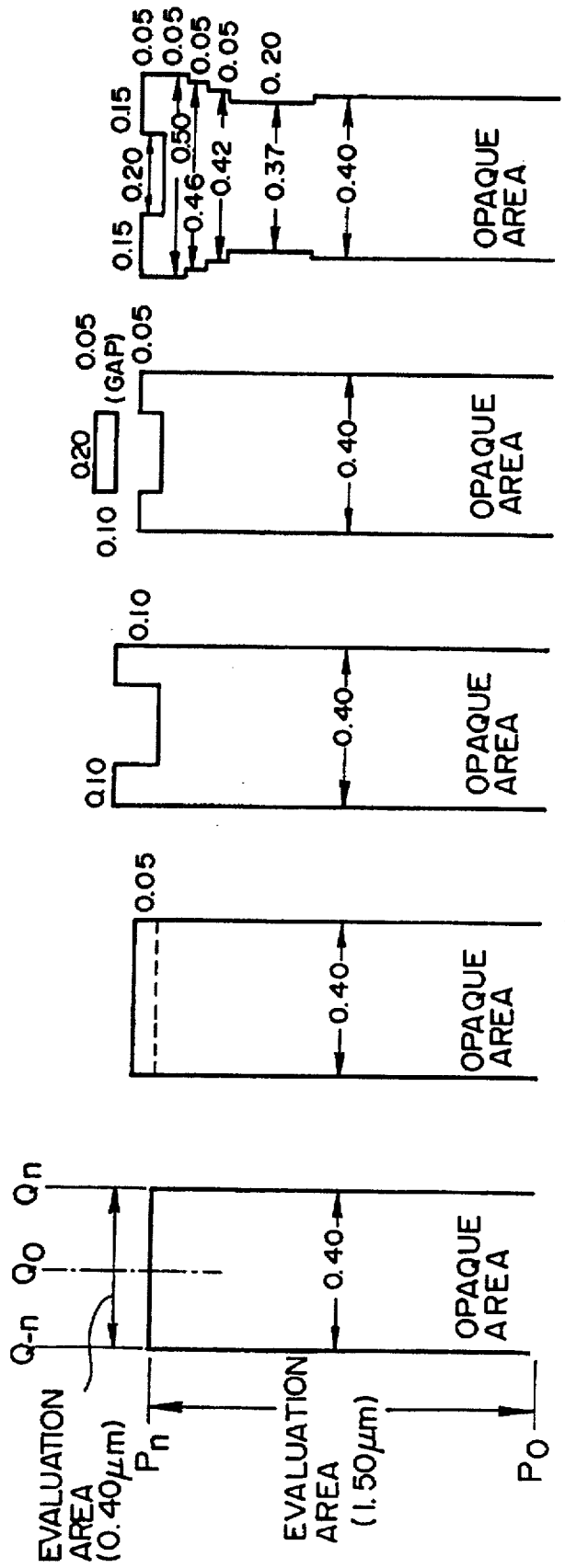

| EVALUATION PATTERN | LATITUDE RATIO | |
|---|---|---|
| A | | ─○─ |
| B | B / A | ─△─ |
| C | C / A | ─□─ |
| D | D / A | ─⊕─ |
| E | E / A | ─⊠─ |

| EVALUATION PATTERN | LATITUDE RATIO | |
|---|---|---|
| A | | ─○─ |
| B | B / A | ─△─ |
| C | C / A | ─□─ |
| D | D / A | ─⊕─ |
| E | E / A | ─⊗─ |

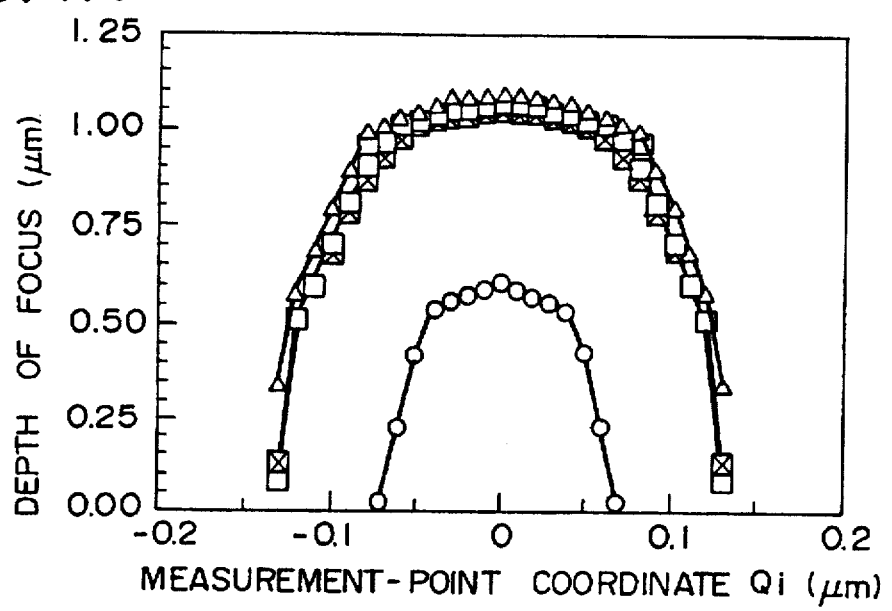
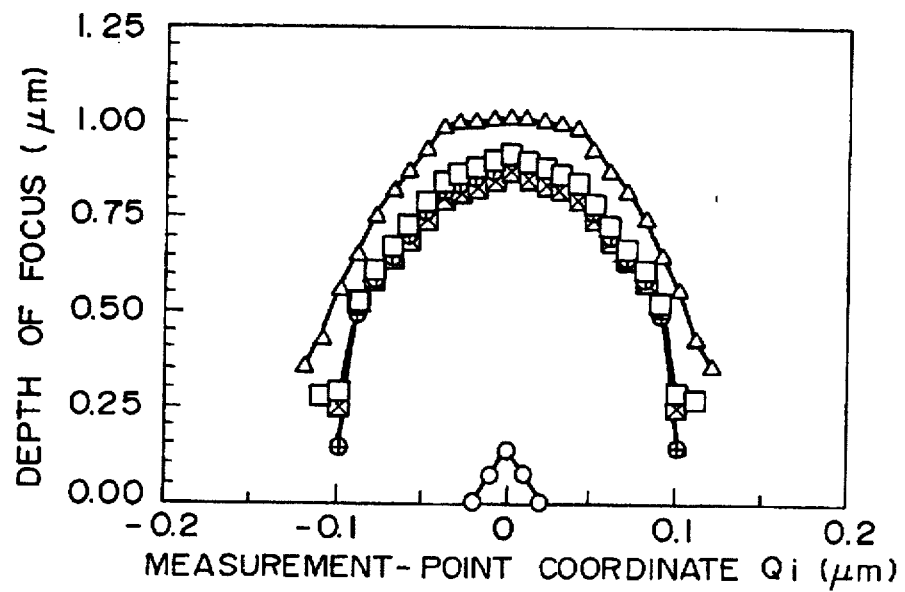

| EVALUATION PATTERN | LATITUDE RATIO | |
|---|---|---|
| A | | —○— |
| B | B/A | —△— |
| C | C/A | —□— |
| D | D/A | —⊕— |
| E | E/A | —⊗— |

| EVALUATION PATTERN | LATITUDE RATIO | |
|---|---|---|
| A | | ─○─ |
| B | B/A | ─△─ |
| C | C/A | ─□─ |
| D | D/A | ─⊕─ |
| E | E/A | ─⊗─ |

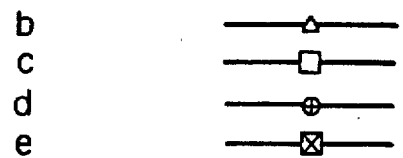
FIG. 13A
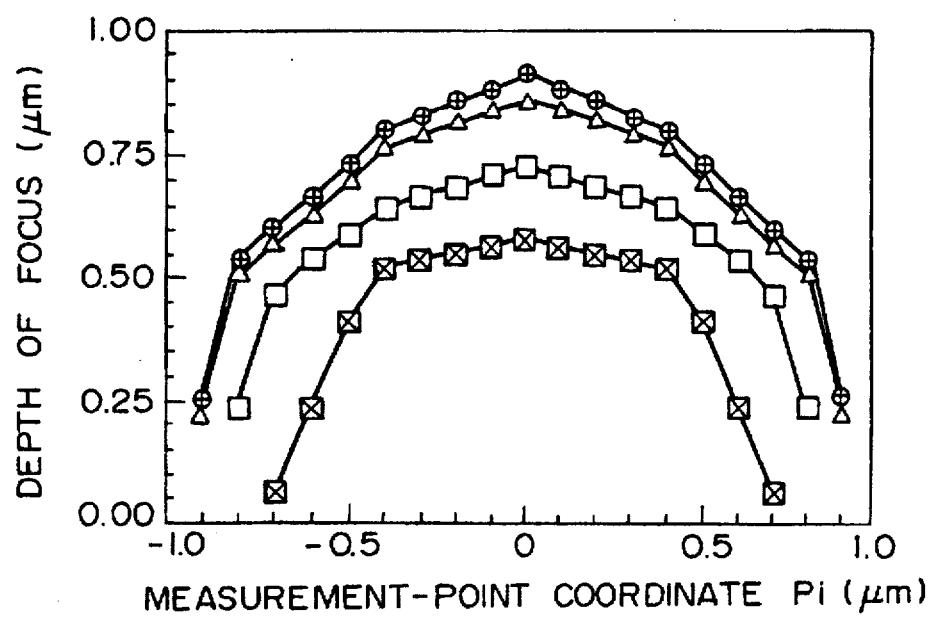
FIG. 13B
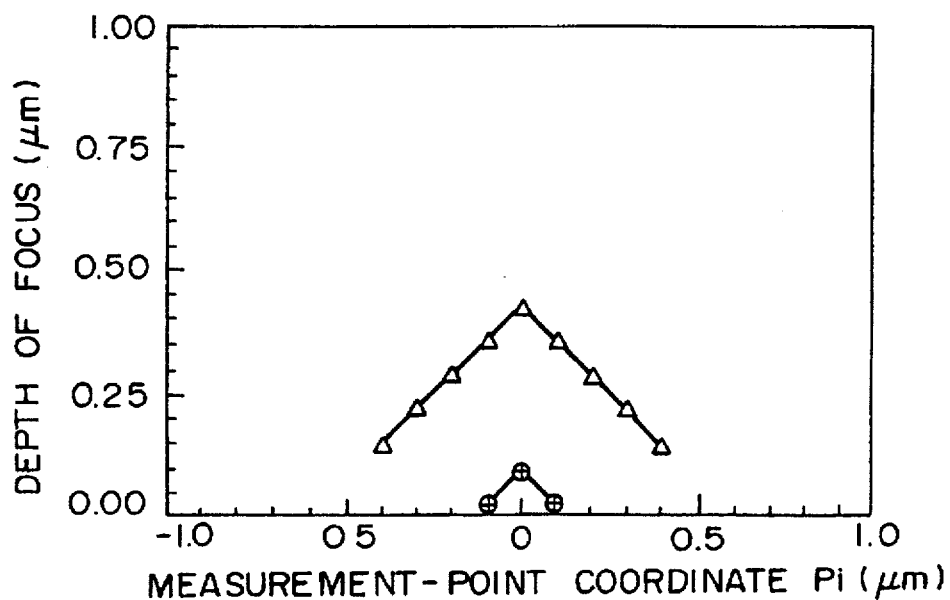

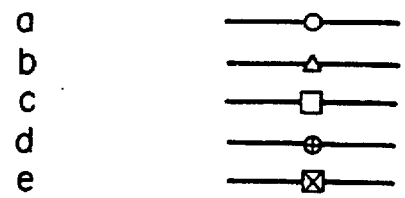
FIG. 14A
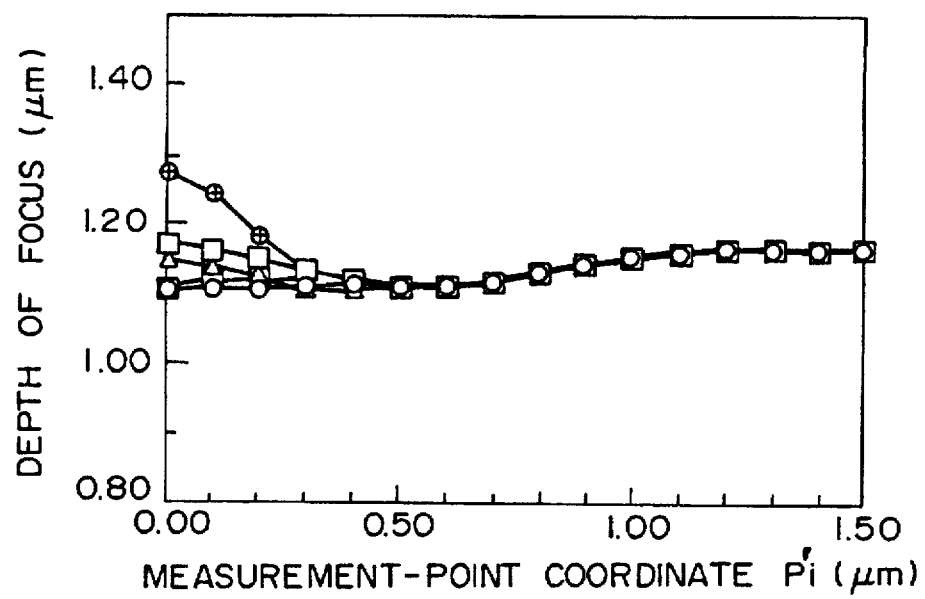
FIG. 14B
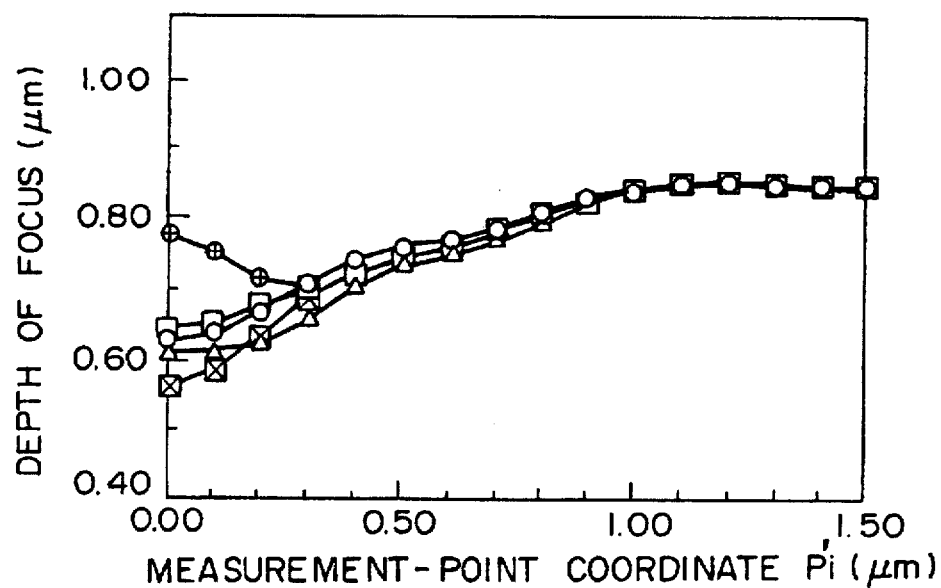

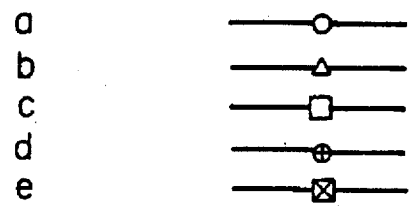
FIG. 15
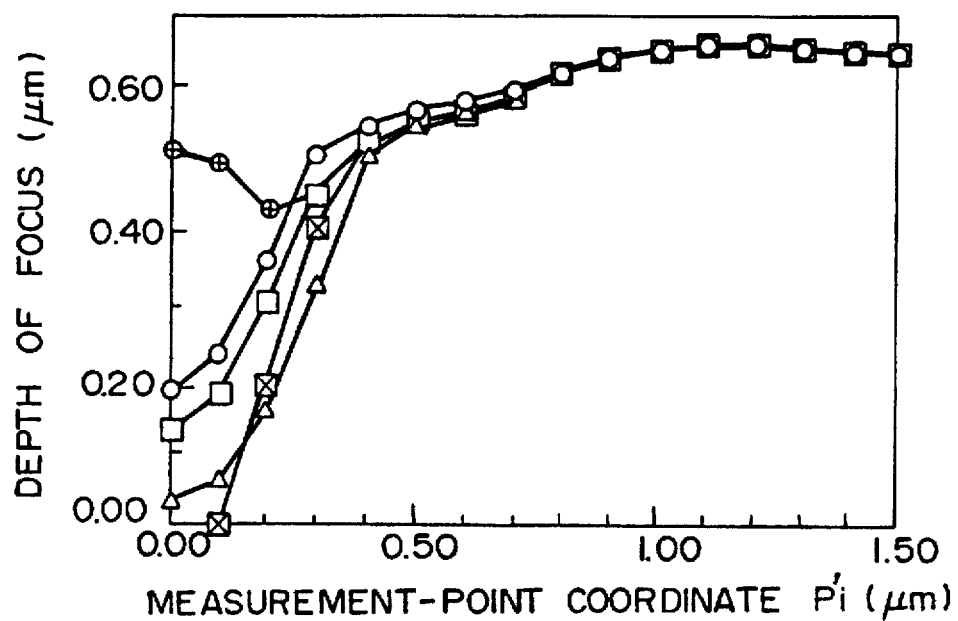

EVALUATION PATTERN

UNCORRECTED —◦—
CORRECTED —□—

EVALUATION PATTERN

UNCORRECTED ──o──
CORRECTED ──□──

EVALUATION PATTERN

| | |
|---|---|
| CENTER SPACE | —○— |
| INNER LINE | —⊙— |
| MIDDLE SPACE | —△— |
| OUTER LINE | —⊠— |
| OUTER SPACE | —□— |

PHOTOMASK-PATTERN-SHAPE EVALUATION METHOD, PHOTOMASK, PHOTOMASK MANUFACTURING METHOD, PHOTOMASK-PATTERN FORMING METHOD, AND EXPOSURE METHOD

BACKGROUND OF THE INVENTION

1. Field of the Invention

The present invention relates to a method for evaluating pattern shapes on a photomask, a photomask which can be used for forming various types of transfer patterns, a method for manufacturing such a photomask, a method for forming the patterns on the photomask, and an exposure method using the photomask.

2. Description of the Related Art

With a photomask used in a pattern transfer process in manufacturing various semiconductor devices, such as memory devices, logic-operation devices, CCD devices and LCD driving devices, that is, a so-called lithography process, a pattern formed on the photomask is transferred, for example, to a resist formed on a substrate made from a wafer. The resist formed on a substrate made from wafer or the like is simply referred to as a resist in this specification unless otherwise specified. A transfer pattern means a pattern formed or to be formed on a resist when a pattern formed on a photomask is transferred, for example, to the resist formed on a substrate made from a wafer, unless otherwise specified.

As semiconductor devices are being made with finer patterns these days, it has been difficult to transfer fine patterns formed on a photomask to a resist at the desired resolution. And it also becomes noticeable that the shape of a pattern formed on a photomask differs from that of the transfer pattern. A square pattern formed on a photomask, for example, may form a circular transfer pattern, or a rectangular pattern formed on a photomask may cause an elliptic transfer pattern. A right-angled corner in a pattern formed on a photomask may form a round corner in the transfer pattern. In the transfer pattern based on a pattern formed on a photomask, with rectangular lines and rectangular spaces being arranged alternatively in a regular fashion and having certain sizes, the lines and spaces may not be arranged alternately in a regular fashion or the lines and spaces may have sizes different from the specified sizes. These deteriorations in the shapes of transfer patterns are caused by a physical phenomenon called the optical proximity effect. They cause deterioration in the performance of semiconductor devices and, in a severe case, semiconductor devices cannot achieve their originally designed performances at all.

An attempt has been made conventionally to compensate for the deterioration in the shape of a transfer pattern by modifying (correcting) the shape of the original pattern formed on a photomask. Such an attempt uses a method for arranging a minute, auxiliary pattern which improves the shape of a transfer pattern but is not transferred itself, at the border of, at the vicinity of, or adjacently to the original pattern formed on a photomask, or a method for providing the original pattern with larger portions and/or smaller portions than the designed pattern, as required. These corrections, applied to a pattern formed on a photomask, are usually based on certain specific transfer conditions (exposure conditions), such as a certain numerical aperture (NA) of a lens, a certain partial coherence (σ), a certain wavelength of exposure light, a certain amount of exposure, a certain amount of defocusing, and a certain pattern size.

Since a conventional method for compensating for the so-called optical proximity effect uses pattern correction conditions found under a certain transfer condition, the following problems take place. When a pattern is formed on a photomask according to a pattern correction condition found under a certain transfer condition and the transfer pattern is formed under a transfer condition other than the certain transfer condition used, it is very difficult to predict whether the same or slightly lower corrected performance than that obtained under the certain transfer condition will be achieved. In manufacturing semiconductor devices, the amount of exposure, the amount of defocusing, and a pattern size on a photomask are, in particular, factors including errors (variations) which significantly affect the shape and size of a transfer pattern. In a range with large errors (variations) in these factors, it is also very difficult to predict whether a pattern correction on a photomask according to factors, such as a certain lens numerical aperture, certain partial coherence (σ), a certain wavelength of exposure light, a certain amount of exposure, a certain amount of defocusing, and a certain pattern size, is appropriate for the actual manufacturing of semiconductor devices. In other words, even if it is determined that a pattern correction on a photomask under a certain transfer condition sufficiently corrects the transfer pattern, the transfer pattern having the desired shape may not be obtained in actual manufacturing of semiconductor devices.

Generally, to evaluate a pattern on a photomask, a change in the shape of the transfer pattern itself is checked. Therefore, even when the pattern on the photomask is corrected with the above-described factors, which include errors (variations) affecting the shape and size of the transfer pattern, being taken into account, since a change in the shape of the transfer pattern itself is checked, it is difficult to check quantitatively whether the pattern correction on the photomask is appropriate.

Among mask-line-width latitude, exposure latitude, and the depth of focus, one latitude has been optimized conventionally. The mask-line-width latitude, the exposure latitude, and the depth of focus mean tolerable errors (tolerable variations) in a mask line width, the amount of exposure, and the amount of defocusing, respectively, in a photomask manufacturing process and exposure process. In other words, even when the mask line width, the amount of exposure, and the amount of defocusing may change within the mask-line-width latitude, the exposure latitude, and the depth of focus, respectively, a transfer pattern having the desired shape and size can be obtained according to the pattern formed on a photomask.

According to the mask line width determined in advance, how the depth of focus is determined will be outlined below as an example. With a constant amount of exposure, the size of the transfer pattern is obtained experimentally or by simulation with the depth of focus being changed. Then, the relationship between the depth of focus and the size of the transfer pattern is obtained as shown in FIG. 29A. According to the pre-determined mask-line-width latitude, the depth of focus is determined.

Alternatively, the mask line width is determined in advance and the depth of focus and the exposure latitude are determined next. This method (called the ED Tree method) will be outlined below. The size of a transfer pattern is obtained experimentally or by simulation with the amount of defocusing and the amount of exposure being changed. Then, a multiple of curves is obtained as shown in FIG. 29B indicating the relationship between the size of the transfer pattern and the amounts of defocusing and exposure.

Assuming that the transfer-line-width latitude is ±10% and the exposure latitude is 20%, for example, the depth of focus can be obtained as shown in FIG. 29B.

In such a conventional latitude determination method, among three latitudes, mask-line-width latitude, exposure latitude, and the depth of focus, only one latitude is determined in advance and one of the remaining kinds of latitude is optimized. Alternatively, two kinds of latitude are determined in advance among the three, and the remaining one latitude is optimized. In this case, only the relationship between the quantity relevant to one of the two kinds of latitude determined in advance (the exposure in the above description) and the quantity related to the latitude to be optimized (the amount of defocusing in the above description) is obtained. The three kinds of latitude are not optimized by relating the three kinds of latitude to each other.

In the method described by referring to FIG. 29A, for example, neither variation in the exposure nor variation in the size of the pattern formed on a photomask is considered. Therefore, the obtained depth of focus is far apart from an appropriate value for the actual manufacturing process of a semiconductor device and is larger than the actual depth of focus. Neither the mask-line-width nor the exposure latitude can be evaluated quantitatively in this method.

Variation in the size of the pattern formed on a photomask is not considered at all as well in the ED tree method, described by referring to FIG. 29B. Therefore, the obtained depth of focus is far apart from an appropriate value for the actual manufacturing process of a semiconductor device. In addition, for example, the mask-line-width latitude cannot be obtained.

SUMMARY OF THE INVENTION

Accordingly, it is the first object of the present invention to provide a photomask-pattern-shape evaluation method which can accurately evaluate pattern correction to be formed on a photomask for compensating for the optical proximity effect within mask-line-width latitude, exposure latitude, and the depth of focus, by expressing the shape of the transfer pattern according to these kinds of latitude, which are tolerable errors (tolerable variations) in terms of the mask line width, the amount of exposure, and the amount of defocusing, which may include errors (variations) affecting the shape of the transfer pattern substantially.

The second object of the present invention is to provide a photomask to which the pattern-shape evaluation method is applied.

The third, fourth, and fifth objects of the present invention are to provide a photomask manufacturing method in which the pattern-shape evaluation method is used, a photomask-pattern forming method in which the pattern-shape evaluation method is used, and an exposure method using the photomask.

The first object is achieved according to this invention through the provision of a pattern-shape evaluation method for a photomask used in a photolithography process wherein patterns formed on the photomask is transferred onto a photoresist formed on a base member with the use of exposure light to form the transfer patterns on the photoresist, the photomask having patterns formed with light-transmission areas and opaque areas, light-transmission areas and semiopaque areas having the phase shift effect, light-transmission areas and semiopaque areas not having the phase shift effect, or light-transmission areas, opaque areas and phase-shift areas. The pattern-shape evaluation method comprises the steps of: specifying a plurality of evaluation patterns to be formed on a photomask and specifying two of three kinds of latitude, mask-line-width latitude, exposure latitude, and the depth of focus; obtaining the transfer pattern corresponding to each of the evaluation patterns with a defocusing value being changed as a changing quantity when the mask-line-width latitude and the exposure latitude are specified, with the amount of exposure being changed as a changing quantity when the mask-line-width latitude and the depth of focus are specified, or with the mask line width of the evaluation patterns being changed as a changing quantity when the exposure latitude and the depth of focus are specified; obtaining the sizes of portions on the transfer pattern at the positions on the transfer pattern corresponding to a plurality of measurement points specified in advance on each of the evaluation patterns; and obtaining the minimum value of the changing quantity as one not-specified latitude within the two kinds of latitude specified for each of the evaluation patterns according to the obtained sizes of the transfer pattern and comparing the obtained latitude for each of the evaluation patterns.

In the pattern-shape evaluation method, it is preferred that one not-specified latitude for each of the evaluation patterns is expressed as a function of the positions of a series of a plurality of measurement points specified in advance on each of the evaluation patterns and the magnitude of the latitude is compared by the whole function.

The second object is achieved according to this invention through the provision of a photomask used in a photolithography process wherein patterns formed on the photomask is transferred onto a photoresist formed on a base member with the use of exposure light to form the transfer pattern on the photoresist, the photomask having patterns formed with light-transmission areas and opaque areas, light-transmission areas and semiopaque areas having the phase shift effect, light-transmission areas and semiopaque areas not having the phase shift effect, or light-transmission areas, opaque areas and phase-shift areas. The patterns are formed in a process comprising the steps of: specifying a plurality of evaluation patterns to be formed on a photomask and specifying two of three kinds of latitude, mask-line-width latitude, exposure latitude, and the depth of focus; obtaining the transfer pattern corresponding to each of the evaluation patterns with a defocusing value being changed as a changing quantity when the mask-line-width latitude and the exposure latitude are specified, with the amount of exposure being changed as a changing quantity when the mask-line-width latitude and the depth of focus are specified, or with the mask line width of the evaluation patterns being changed as a changing quantity when the exposure latitude and the depth of focus are specified; obtaining the sizes of portions on the transfer pattern at the positions on the transfer pattern corresponding to a plurality of measurement points specified in advance on each of the evaluation patterns; and obtaining the minimum value of the changing quantity as one not-specified latitude within the two kinds of latitude specified for each of the evaluation patterns according to the obtained sizes of the transfer pattern, comparing the obtained latitude for each of the evaluation patterns, and determining the evaluation pattern having the largest of the one not-specified latitude among the evaluation patterns as a pattern to be formed on the photomask.

In the photomask, it is preferred that one not-specified latitude for each of the evaluation patterns is expressed as a function of the positions of a series of a plurality of measurement points specified in advance on each of the evaluation patterns and the magnitude of the latitude is compared by the whole function.

The third object is achieved according to this invention through the provision of a photomask manufacturing method for a photomask used in a photolithography process wherein patterns formed on the photomask is transferred onto a photoresist formed on a base member with the use of exposure light to form the transfer pattern on the photoresist, the photomask having patterns formed with light-transmission areas and opaque areas, light-transmission areas and semiopaque areas having the phase shift effect, light-transmission areas and semiopaque areas not having the phase shift effect, or light-transmission areas, opaque areas and phase-shift areas. The photomask manufacturing method comprises the steps of: specifying a plurality of evaluation patterns to be formed on a photomask and specifying two of three kinds of latitude, mask-line-width latitude, exposure latitude, and the depth of focus; obtaining the transfer pattern corresponding to each of the evaluation patterns with a defocusing value being changed as a changing quantity when the mask-line-width latitude and the exposure latitude are specified, with the amount of exposure being changed as a changing quantity when the mask-line-width latitude and the depth of focus are specified, or with the mask line width of the evaluation patterns being changed as a changing quantity when the exposure latitude and the depth of focus are specified; obtaining the sizes of portions on the transfer pattern at the positions on the transfer pattern corresponding to a plurality of measurement points specified in advance on each of the evaluation patterns; obtaining the minimum value of the changing quantity as one not-specified latitude within the two kinds of latitude specified for each of the evaluation patterns according to the obtained sizes of the transfer pattern; and comparing each of the obtained latitude for each evaluation pattern and forming the evaluation pattern having the largest of one not-specified latitude among the evaluation patterns on the photomask.

In the photomask manufacturing method, it is preferred that one not-specified latitude for each of the evaluation patterns is expressed as a function of the positions of a series of a plurality of measurement points specified in advance on each of the evaluation patterns and the magnitude of the latitude is compared by the whole function.

The fourth object is achieved according to this invention through the provision of a pattern forming method for patterns used in a photolithography process wherein patterns formed on a photomask is transferred onto a photoresist formed on a base member with the use of exposure light to form the transfer pattern on the photoresist, the patterns being formed with light-transmission areas and opaque areas, light-transmission areas and semiopaque areas having the phase shift effect, light-transmission areas and semiopaque areas not having the phase shift effect, or light-transmission areas, opaque areas and phase-shift areas. The pattern forming method comprises the steps of: specifying a plurality of evaluation patterns to be formed on a photomask and specifying two of three kinds of latitude, mask-line-width latitude, exposure latitude, and the depth of focus; obtaining the transfer pattern corresponding to each of the evaluation patterns with a defocusing value being changed as a changing quantity when the mask-line-width latitude and the exposure latitude are specified, with the amount of exposure being changed as a changing quantity when the mask-line-width latitude and the depth of focus are specified, or with the mask line width of the evaluation patterns being changed as a changing quantity when the exposure latitude and the depth of focus are specified; obtaining the sizes of portions on the transfer pattern at the positions on the transfer pattern corresponding to a plurality of measurement points specified in advance on each of the evaluation patterns; obtaining the minimum value of the changing quantity as one not-specified latitude within the two kinds of latitude specified for each of the evaluation patterns according to the obtained sizes of the transfer pattern; and comparing each of the obtained latitude for each evaluation pattern and forming the evaluation pattern having the largest of one not-specified latitude among the evaluation patterns on the photomask.

In the pattern forming method, it is preferred that one not-specified latitude for each of the evaluation patterns is expressed as a function of the positions of a series of a plurality of measurement points specified in advance on each of the evaluation patterns and the magnitude of the latitude is compared by the whole function.

The fifth object is achieved according to this invention through the provision of an exposure method for forming a transfer pattern on a photoresist by transferring patterns formed on a photomask onto the photoresist formed on a base member, the photomask having patterns formed with light-transmission areas and opaque areas, light-transmission areas and semiopaque areas having the phase shift effect, light-transmission areas and semiopaque areas not having the phase shift effect, or light-transmission areas, opaque areas and phase-shift areas. The exposure method uses the photomask manufactured in a process comprising the steps of: specifying a plurality of evaluation patterns to be formed on a photomask and specifying two of three kinds of latitude, mask-line-width latitude, exposure latitude, and the depth of focus; obtaining the transfer pattern corresponding to each of the evaluation patterns with a defocusing value being changed as a changing quantity when the mask-line-width latitude and the exposure latitude are specified, with the amount of exposure being changed as a changing quantity when the mask-line-width latitude and the depth of focus are specified, or with the mask line width of the evaluation patterns being changed as a changing quantity when the exposure latitude and the depth of focus are specified; obtaining the sizes of portions on the transfer pattern at the positions on the transfer pattern corresponding to a plurality of measurement points specified in advance on each of the evaluation patterns; obtaining the minimum value of the changing quantity as one not-specified latitude within the two kinds of latitude specified for each of the evaluation patterns according to the obtained sizes of the transfer pattern; and comparing each of the obtained latitude for each evaluation pattern and forming the evaluation pattern having the largest of one not-specified latitude among the evaluation patterns on the photomask.

In the exposure method, it is preferred that one not-specified latitude for each of the evaluation patterns is expressed as a function of the positions of a series of a plurality of measurement points specified in advance on each of the evaluation patterns and the magnitude of the latitude is compared by the whole function.

As a photomask according to the present invention, the following photomasks may be used. A photomask having patterns formed with light-transmission areas and opaque areas, a so-called half-tone phase-shift photomask having patterns formed with light-transmission areas and semiopaque areas which have a phase-shift effect, a photomask having patterns formed with light-transmission areas and semiopaque areas which do not have a phase-shift effect, and phase-shift photomasks having patterns formed with light-transmission areas, opaque areas, and phase-shift areas, such as those of Levenson-type, edge-enhancement-type, and auxiliary-pattern-type.

In the present invention, two of three kinds of latitude, mask-line-width latitude, exposure latitude, and the depth of focus, are specified in advance and the remaining latitude, which is not specified, is obtained by calculating the minimum value of the corresponding quantity within the two kinds of latitude specified. When two kinds of latitude, mask-line-width latitude and exposure latitude, are specified among three kinds of latitude, the mask-line-width latitude, the exposure latitude, and the depth of focus, for example, the depth of focus, which is not yet specified, is obtained. The depth of focus is the minimum value of the corresponding defocusing values within the mask-line-width latitude and the exposure latitude. Therefore, even when variation in the size of a pattern formed on a photomask occurs in manufacturing photomasks or variation in the amount of exposure occurs, if these variations fall in the mask-line-width latitude and the exposure latitude, variation in the size of the transfer pattern can fall in the desired range against the target value in a certain transfer condition (exposure condition) with defocusing variation falling in the depth of focus. In other words, the three kinds of latitude, the mask-line-width latitude, the exposure latitude, and the depth of focus, can be optimized and whether the most appropriate correction for the optical proximity effect is conducted for a pattern formed on a photomask can be actually checked.

When two kinds of latitude, mask-line-width latitude and the depth of focus, are specified among three kinds of latitude, the mask-line-width latitude, exposure latitude, and the depth of focus, for example, the exposure latitude, which is not yet specified, is obtained. The exposure latitude is the minimum value of the corresponding amounts of exposure within the mask-line-width latitude and the depth of focus. Therefore, even when variation in the size of a pattern formed on a photomask occurs in manufacturing photomasks or variation in the depth of focus occurs, if these variations fall in the mask-line-width latitude and the depth of focus, variation in the size of the transfer pattern can fall in the desired range against the target value in a certain transfer condition (exposure condition) with variation in the amount of exposure falling in the exposure latitude. In other words, the three kinds of latitude, the mask-line-width latitude, the exposure latitude, and the depth of focus, can be optimized and whether the most appropriate correction for the optical proximity effect is conducted for a pattern formed on a photomask can be actually checked.

When two kinds of latitude, the depth of focus and exposure latitude, are specified among three kinds of latitude, mask-line-width latitude, the exposure latitude, and the depth of focus, for example, the mask-line-width latitude, which is not yet specified, is obtained. The mask-line-width latitude is the minimum value of variation in the mask line widths of an evaluation pattern within the depth of focus and the exposure latitude. Therefore, even when variation in the amount of exposure or that in the defocusing value occurs, if these variations fall in the exposure latitude and the depth of focus, variation in the size of the transfer pattern can fall in the desired range against the target value when variation in the mask line width falls in the mask-line-width latitude even if variation in the size of a pattern formed on a photomask occurs in manufacturing photomasks. In other words, the three kinds of latitude, the mask-line-width latitude, the exposure latitude, and the depth of focus, can be optimized and whether the most appropriate correction for the optical proximity effect is conducted for a pattern formed on a photomask can be actually checked.

In addition, according to the present invention, when latitude which is not specified on each evaluation pattern is expressed with a function of positions of a series of a multiple of measurement points specified in advance on the evaluation pattern, and the magnitude of the latitude in the obtained function is compared with those in all functions, each latitude, obtained for the corresponding pattern, can be compared more quantitatively and more reasonably.

BRIEF DESCRIPTION OF THE DRAWINGS

FIGS. 2A to 2E are typical plans of evaluation patterns.

FIGS. 7A and 7B show graphs indicating evaluation results for the depth of focus in example 2.

FIGS. 13A and 13B show graphs indicating evaluation results for the depth of focus in example 5.

FIGS. 14A and 14B show graphs indicating evaluation results for the depth of focus in example 6.

FIG. 15 shows a graph indicating evaluation results for the depth of focus in example 6.

DETAILED DESCRIPTION OF THE PREFERRED EMBODIMENTS

Figure 1A:
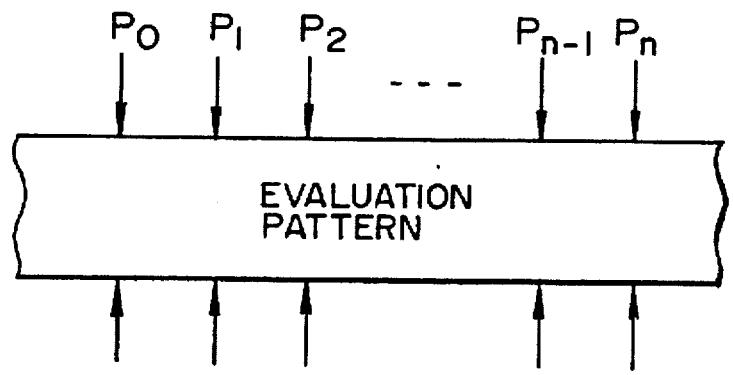
FIGS. 1A, 1B, and 1C are typical views showing the arrangement of measurement points.

Preferred embodiments will be described below by referring to the drawings. The present invention is not restricted to the embodiments and the examples described below.

When a transfer pattern is formed on a resist material formed on a wafer with exposure light, the original pattern may be called a reticle and its duplicate may be called a mask, or the original pattern used for reduction-projection may be called a reticle and the pattern used for the same-size projection may be called a mask. In this specification, the reticles and masks used in these senses are collectively called photomasks unless otherwise noted. In the following embodiments, photomasks for five-times projection were used. This means that the design size of a pattern formed on a photomask is five times as large as that of the corresponding transfer pattern. Lengths and sizes related to a pattern or the position of a point where measurement is performed are those on a transfer pattern or that on a transfer pattern in the following descriptions unless otherwise noted. To calculate the size or position of a pattern formed on a photomask, the size or position of the corresponding transfer pattern is multiplied by five.

In the following embodiments, a tolerable variation in the size of a transfer pattern (a pattern width, for example) was set to ±10% against the target value unless otherwise noted. A transfer pattern was obtained from optical strength distribution obtained by simulation (calculation) based on the partial coherence theory, proposed by Mr. H. H. Hopkins. A transfer pattern can also be obtained with a method for actually forming a transfer pattern on a resist or a combination of such a method and simulation.

Figure 1B:
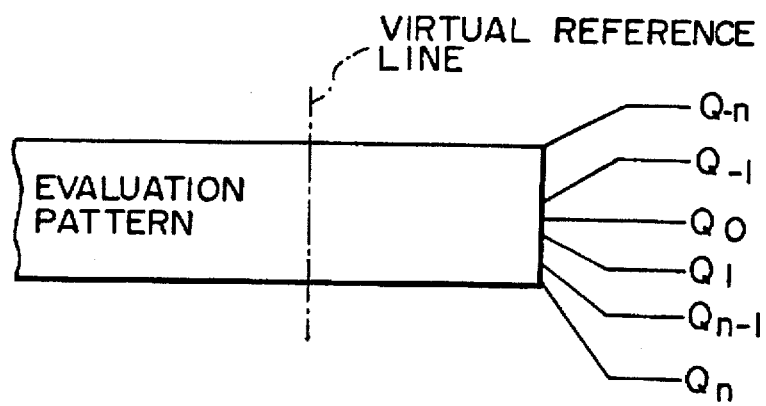
Figure 1C:
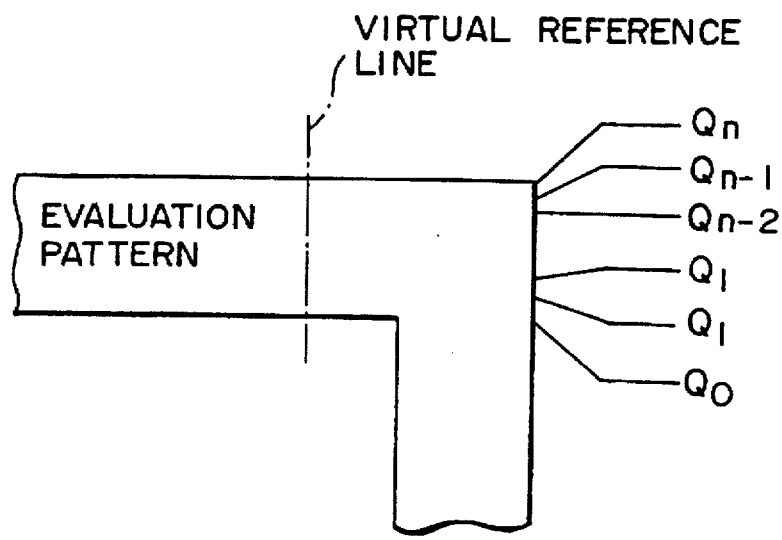

When the shape of a transfer pattern is evaluated from a pattern width in the following embodiments, the size of each portion in the transfer pattern (pattern width of the transfer pattern) is obtained at a plurality of measurement points specified in advance on an evaluation pattern, for example, at the points on the transfer pattern corresponding to the measurement points from $P_0$ to $P_n$ as shown in FIG. 1A. To evaluate the shape of a tip portion of a straight evaluation pattern or the shape of a corner of an evaluation pattern having right-angled corners, the distances are obtained between the virtual reference line on the transfer pattern corresponding to a virtual reference line on the evaluation pattern and the position on the transfer pattern corresponding to measurement points at the edge on the evaluation pattern (measurement points $Q_0$ to $Q_n$, or $Q_{-n}$ to $Q_n$, for example), as typically shown in FIG. 1B or FIG. 1C. These cases also correspond to obtaining the size of each portion on a transfer pattern at the positions on the transfer pattern corresponding to a plurality of measurement points specified in advance on the evaluation pattern.

EXAMPLE 1

Example 1 relates to a pattern-shape evaluation method for a usual photomask having patterns formed with light-transmission areas and opaque areas. Such a photomask is used for transferring the patterns formed on the photomask onto a photoresist formed on a substrate with exposure light in a photolithography process in which the transfer pattern is formed on the photoresist.

FIGS. 2A to 2E show various types of evaluation patterns on a photoresist. FIG. 2A shows an evaluation pattern having an isolated line with a width of 0.40 µm. The width of the corresponding design pattern on a photomask is 2.00 µm. No correction against the optical proximity effect was applied to this evaluation pattern. The pattern corresponds to the pattern enlarged by a factor of five from the design transfer pattern. In the following descriptions, an evaluation pattern which is enlarged by a factor of five from the design transfer pattern is called a basic pattern. Corrections against the optical proximity effect were applied to the evaluation patterns shown in FIGS. 2B to 2E. In other words, evaluation patterns on a photomask having shapes created by correcting that of the basic pattern, shown in FIG. 2A, are shown in FIGS. 2B to 2E. The evaluation pattern in FIG. 2B has a tip portion extended by 0.05 µm from that of the basic pattern. The evaluation pattern in FIG. 2C has minute, auxiliary patterns extended from the tip portion of the basic pattern. In the evaluation pattern in FIG. 2D, minute, auxiliary patterns are extended from the tip portion of the basic pattern and another minute, auxiliary pattern is disposed apart from the tip portion of the basic pattern. In the evaluation pattern shown in FIG. 2E, minute, auxiliary patterns are extended from the tip portion of the basic pattern and the width of the design pattern is enlarged and reduced in the vicinity of the tip portion of the basic pattern as required. The unit for numerals used in FIG. 2 is µm. The evaluation patterns shown in FIGS. 2A to 2E may be called evaluation pattern A, evaluation pattern B, evaluation pattern C, evaluation pattern D, and evaluation pattern E, respectively. The shapes of the evaluation patterns shown in FIGS. 2B to 2E were determined according to various pieces of information.

In example 1, with the pattern widths of the transfer patterns obtained from evaluation patterns A to E, shown in FIGS. 2A to 2E, the shapes of the patterns formed on a photomask were evaluated.

The widths of the transfer patterns were obtained in example 1 by simulation with evaluation patterns A to E, shown in FIGS. 2A to 2E, under the exposure condition of NA=0, σ=0.6, and the wavelength of exposure light being equal to 365 nm.

Among three kinds of latitude, mask-line-width latitude, exposure latitude, and the depth of focus, two kinds of latitude, the mask-line-width latitude and the exposure latitude, were set to 0.00 µm and 0.0%. The mask-line-width latitude is that on the photomask. This applies to the following examples.

The mask-line-width latitude and the exposure latitude were specified in example 1. With a defocusing value being changed, the transfer pattern corresponding to each evaluation pattern was obtained by simulation. The defocusing value changed to ±mX µm against the in-focus point, where m is 0, 1, 2, 3, . . . , 8 and X equals 0.25.

The sizes (pattern widths in example 1) of a transfer pattern were obtained at the positions corresponding to a plurality of measurement points specified in advance on each of the five evaluation patterns (see FIG. 1A also). 19 measurement points, $P_0$ to $P_n$, were disposed within a distance of 1.50 µm with an interval of 0.1 µm between measurement points which were disposed at 0.00 to 1.20 µm and an interval of 0.05 µm between measurement points which were disposed at 1.20 to 1.50 µm. Measurement point $P_0$ was disposed at the point 1.50 µm apart from the tip portion of the basic pattern (see FIG. 2A) and measurement point $P_n$ was disposed at the tip.

Figure 3A:
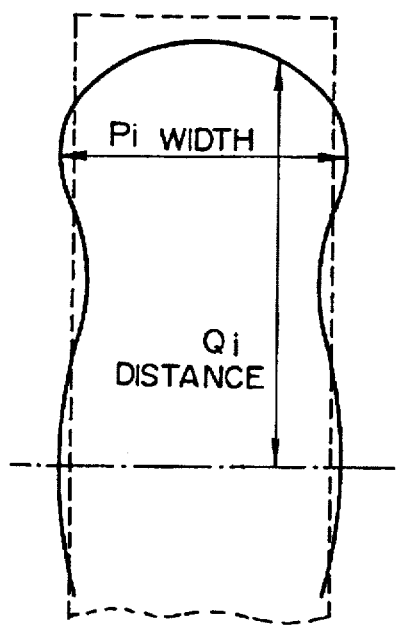
FIG. 3A is a typical plan of the transfer pattern based on the basic pattern.
Figure 3B:
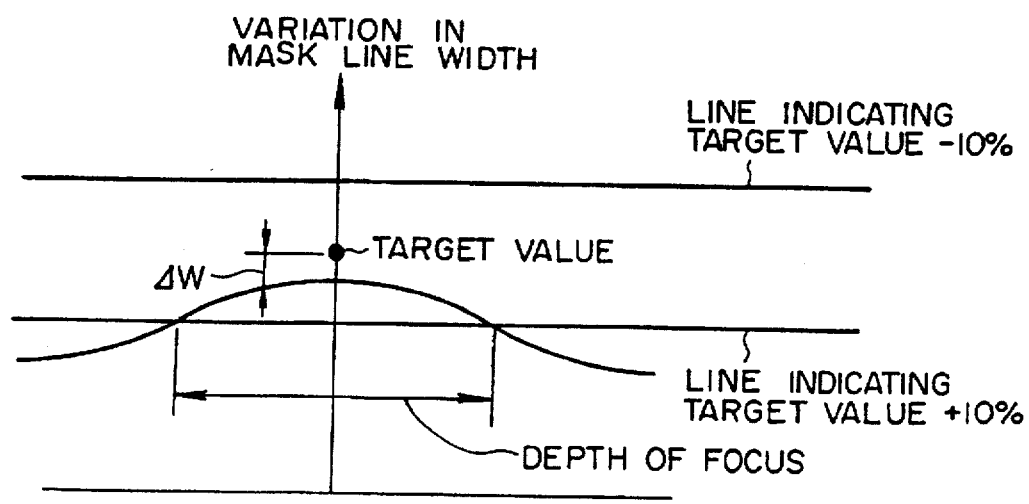
FIG. 3B typically illustrates the relationship between variation against the target pattern width and variation in a defocusing value.

When the basic pattern, shown in FIG. 2A, formed on a photomask is transferred onto a resist, the transfer pattern typically shown in FIG. 3A with a thick line is usually obtained. The shape drawn with a dotted line indicates the pattern formed by reduction-projection of the basic pattern itself on the resist. With the mask-line-width latitude and the exposure latitude being fixed, the pattern width at the position on the transfer pattern corresponding to measurement point $P_1$ changes as the defocusing value changes. FIG. 3B typically shows the relationship between the defocusing value and variation ($\Delta W$) in the pattern width against the target value.

According to the obtained sizes of the transfer patterns (pattern width in example 1), the minimum value of the quantity (defocusing value in example 1) corresponding to one latitude which was not specified (the depth of focus in example 1) was obtained within the other two kinds of latitude, which were specified, (mask-line-width latitude and exposure latitude) for each of evaluation patterns A to E, shown in FIGS. 2A to 2E. For convenience, in the following descriptions, the one latitude not specified may be called not-specified latitude and the two kinds of specified latitude may be called specified latitude.

In the examples, since the tolerance of variation in the size (pattern width, for example) of a transfer pattern was set to ±10% against the target value, the defocusing values were obtained at each measurement point when variation in the pattern width ($\Delta W$) equals ±10% of the target value. Then, the minimum value of variation in the defocusing values at each measurement point was regarded as not-specified latitude to be obtained at each measurement point (the depth of focus in example 1). This latitude was obtained at each measurement point for each evaluation pattern.

Since the mask-line-width latitude and the exposure latitude were set to 0.00 μm (on the photomask) and 0.0% in example 1, there was actually no range corresponding to the two kinds of latitude specified. Therefore, the minimum value of variation in the defocusing values at each point equals the variation in the defocusing value itself.

Figure 4A:
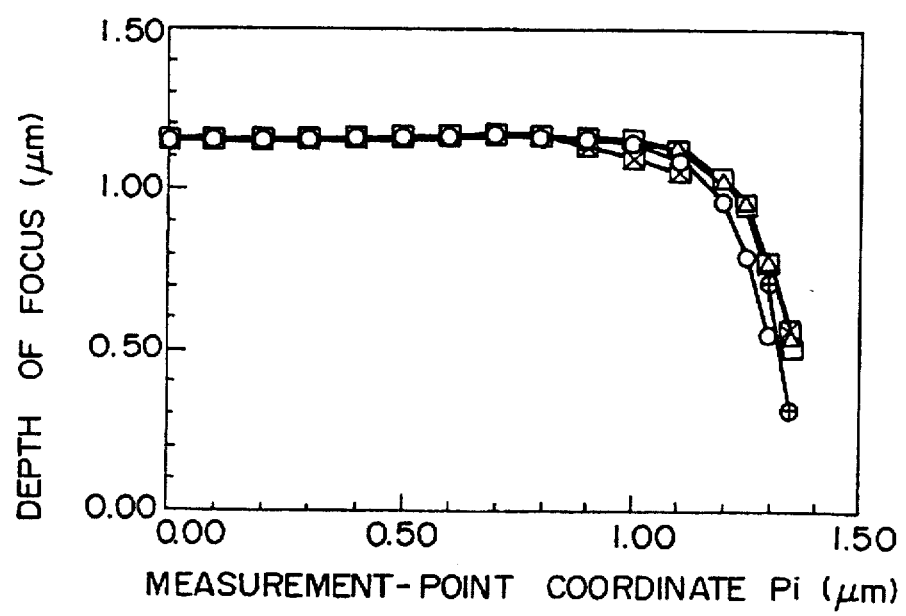
FIGS. 4A and 4B show graphs indicating evaluation results for the depth of focus.
Figure 4B:
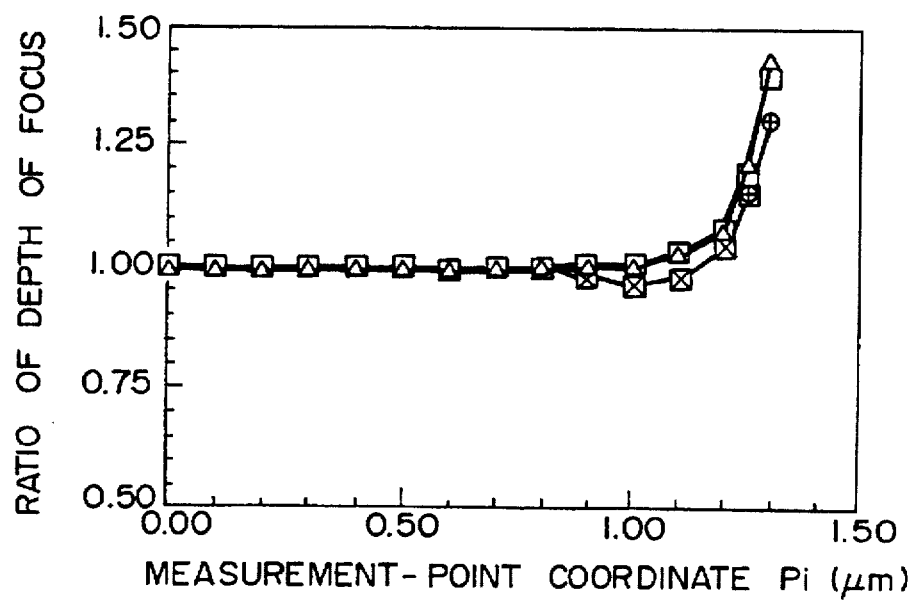

For each evaluation pattern, one latitude which was not specified at each measurement point (the depth of focus in example 1) was expressed as a function of the positions of a series of a multiple of measurement points ($P_0$ to $P_n$) specified in advance on each evaluation pattern. FIG. 4A shows such functions (five curves) for the depth of focus (unit: μm) with the positions of the measurement points being set along the horizontal axis. The measurement point having a position of 0.00 μm was actually disposed at the point 1.50 μm apart from the tip portion of the basic pattern. As the position value increases, the corresponding measurement point approaches the tip portion of the basic pattern. This is also applied to the other drawings which have the horizontal axis for the positions of measurement points. FIG. 4B shows the functions (four curves) of the value of (the depth of focus for evaluation patterns B to E)/(the depth of focus for evaluation pattern A), (which may be called the ratio of the depth of focus), with the positions of measurement points being set along the horizontal axis. It can be said that the functions shown in FIGS. 4A and 4B express the shapes of the transfer patterns according to the mask-line-width latitude, the exposure latitude, and the depth of focus. This can also be said for the following functions.

The obtained not-specified latitude for the evaluation patterns is compared with each other to evaluate the shapes of the evaluation patterns. In example 1, the latitude for evaluation pattern A was compared with the latitude for the other evaluation patterns to select the evaluation pattern having the largest depth of focus as the pattern to be actually formed on a photomask. It is preferable to compare the magnitude of the one not-specified latitude in the obtained function by the whole function, shown in FIGS. 4A and 4B. According to FIGS. 4A and 4B, Table 1 shows the results of evaluation for the depth of focus.

In Table 1, expression (A)<(B) means that evaluation pattern B, shown in FIG. 2B, has a larger not-specified latitude than evaluation pattern A, shown in FIG. 2A. Expression (A)≈(B) indicates that evaluation patterns A and B have a similar value of not-specified latitude. These expressions are also used in the other tables.

The same evaluation of pattern shapes was conducted with the two kinds of latitude specified, the mask-line-width latitude and the exposure latitude, being set to ±0.05 μm (on a photomask) and ±5.0% respectively. When the two kinds of latitude specified have their ranges as described above, the actual ranges exist. The mask-line-width latitude is changed, for example, from 0.00 μm at an interval of 0.01 μm (on the photomask), and the exposure latitude is changed, for example, from 0.0% at an interval of 1%. With each combination of mask-line-width latitude and exposure latitude, the defocusing value is obtained at each measurement point when variation in the pattern width ($\Delta W$) equals 10%. Then, the minimum value, $Val_{MIN}$, of variation in the defocusing values at each measurement point is obtained. This process is conducted for each evaluation pattern.

The minimum value, $Val_{MIN}$, of variation in the defocusing values is obtained for all combinations of values in the mask-line-width latitude and the exposure latitude. Then, as typically shown in FIG. 2S, a curved surface is obtained on which the absolute value, $|Val_{MIN}|$, of the minimum value of variation in the defocusing values changes at each measurement point in the three-dimensional coordinate system with the mask-line-width latitude set along the X axis, the exposure latitude set along the Y axis, and the minimum value, $Val_{MIN}$, of variation in the defocusing values set along the Z axis. Generally on such a curved surface, as the mask-line-width latitude and/or the exposure latitude increase, the absolute value, $|Val_{MIN}|$, of the minimum value of variation in the defocusing values tends to decrease. For each evaluation pattern, of the absolute values of the minimum values of the changing quantity (the defocusing values in example 1) at each measurement point within the two kinds of latitude specified, the minimum value is obtained and it is regarded as the minimum value of the changing quantity. This minimum value of the changing quantity corresponds to not-specified latitude (the depth of focus in example 1) at each measurement point.

The not-specified latitude obtained as described above at each measurement point is the minimum latitude within the specified kinds of latitude. Therefore, even when variation in the size of a pattern formed on a photomask occurs in manufacturing photomasks or variation in the amount of exposure occurs, for example, if these variations fall in the mask-line-width latitude and the exposure latitude, variation in the size of the transfer pattern (pattern width, for example) can fall in a range of ±10% of the target value under a certain transfer condition (exposure condition) in evaluating pattern shapes, with defocusing variation falling in the not-specified latitude.

Figure 5A:
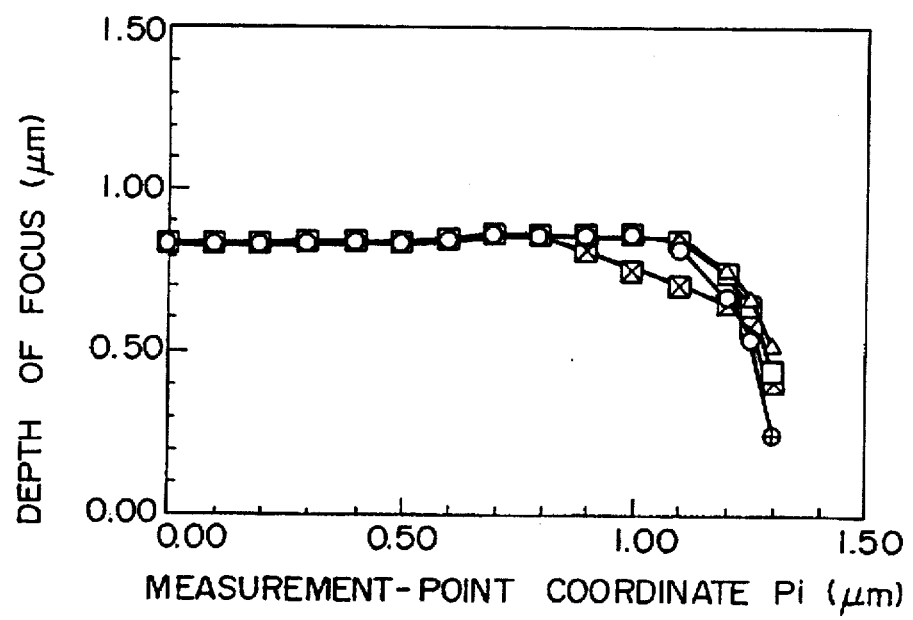
FIGS. 5A and 5B show graphs indicating evaluation results for the depth of focus in example 1.
Figure 5B:
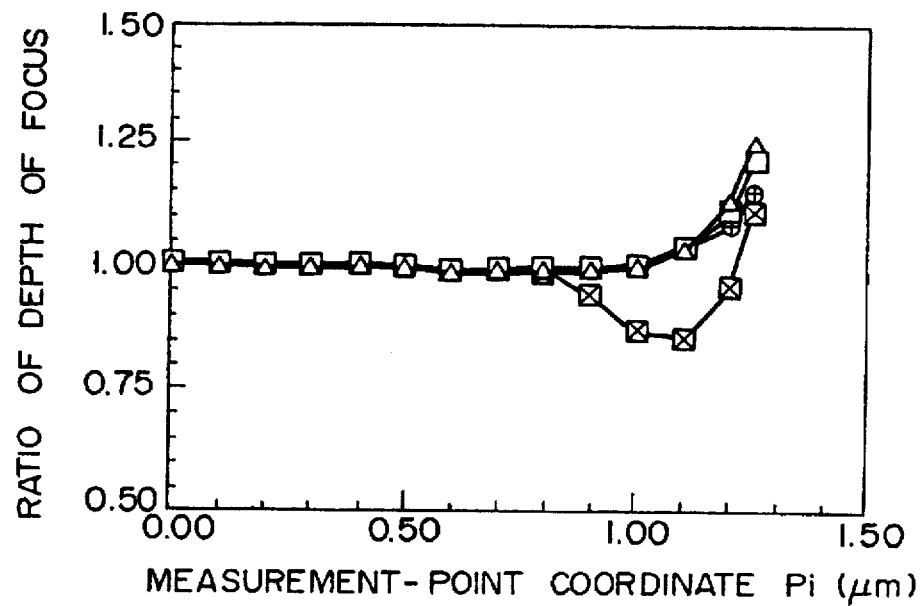

For each evaluation pattern, one latitude which was not specified at each measurement point (the depth of focus in example 1) was expressed as a function of the positions of a series of a multiple of measurement points ($P_0$ to $P_n$)

specified in advance on each evaluation pattern. FIG. 5A shows such functions (five curves) for the depth of focus (unit: μm) with the positions of the measurement points being set along the horizontal axis. FIG. 5B shows the functions (four curves) of the value of (the depth of focus for evaluation patterns B to E)/(the depth of focus for evaluation pattern A), which is the ratio of the depth of focus. According to FIGS. 5A and 5B, Table 1 shows the results of comparison for the depth of focus.

The two kinds of latitude specified, the mask-line-width latitude and the exposure latitude, were then set to ±0.05 μm (on the photomask) and ±10.0% respectively, and the same evaluation of the pattern shapes was conducted.

Figure 6A:
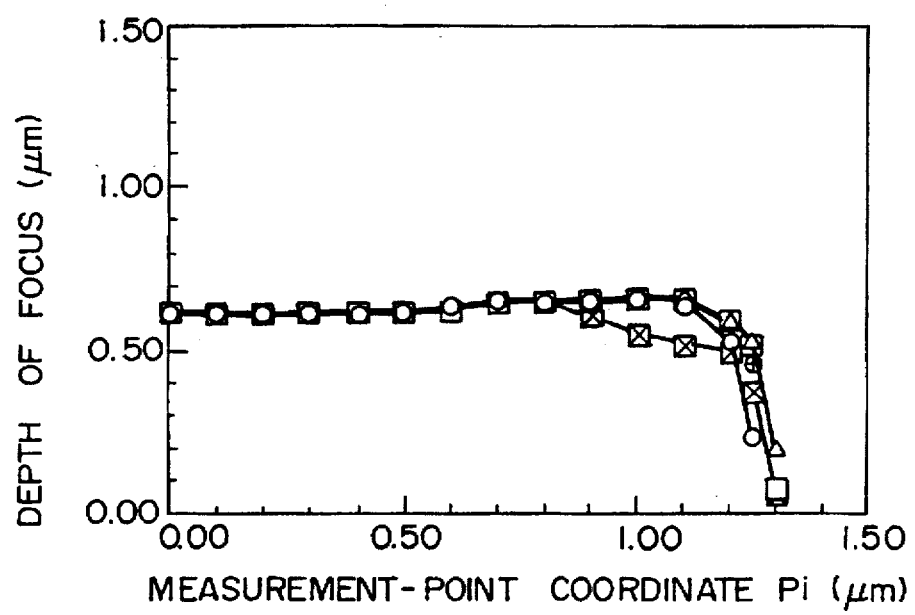
FIGS. 6A and 6B show graphs indicating evaluation results for the depth of focus in example 1.
Figure 6B:
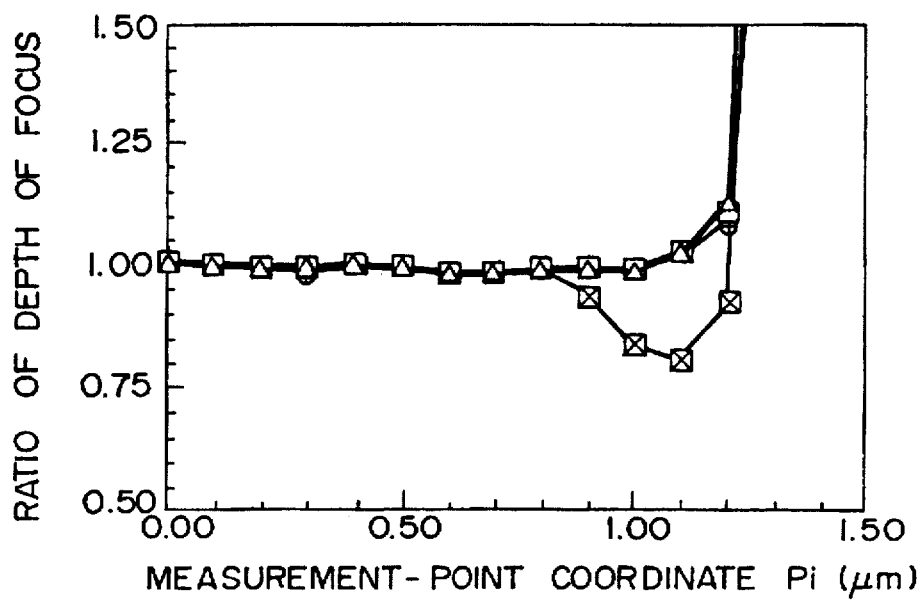

For each evaluation pattern, one latitude which was not specified at each measurement point (the depth of focus in example 1) was expressed as a function of the positions of a series of a multiple of measurement points ($P_0$ to $P_n$) specified in advance on each evaluation pattern. FIG. 6A shows such functions (five curves) for the depth of focus (unit: μm) with the positions of the measurement points being set along the horizontal axis. FIG. 6B shows the functions (four curves) of the value of (the depth of focus for evaluation patterns B to E)/(the depth of focus for evaluation pattern A), which is the ratio of the depth of focus. According to FIGS. 6A and 6B, Table 1 shows the results of comparison for the depth of focus.

From the results in example 1, it was found that evaluation pattern B or C, shown in FIGS. 2B or 2C, has the largest depth of focus.

focus, two kinds of latitude, the mask-line-width latitude and the exposure latitude, were set to 0.00 μm and 0.0%, and ±0.05 μm and ±5.0% in example 2.

The mask-line-width latitude and the exposure latitude were specified in example 2. With a defocusing value being changed, the transfer pattern corresponding to each evaluation pattern was obtained by simulation. The defocusing value changed in the same way as for example 1.

The sizes of a transfer pattern were obtained at the positions corresponding to a plurality of measurement points specified in advance on each of the five evaluation patterns. In example 2, a plurality of measurement points were disposed in advance on the evaluation patterns at the portions corresponding to the tip portion of the evaluation pattern A (see FIG. 2A), which is the basic pattern. In other words, the sizes of a transfer pattern were measured at the positions on the transfer pattern corresponding to 41 measurement points, $Q_{-n}$ to $Q_n$, which were different from those used in example 1 and disposed within a distance of 0.40 μm at an interval of 0.01 μm. In each evaluation pattern, the distances from the virtual reference line on the transfer pattern corresponding to that on an evaluation pattern to the positions on the transfer pattern corresponding to measurement points ($Q_{-n}$ to $Q_n$) at the edge of the basic pattern, as typically shown in FIG. 1B.

When evaluation pattern A, which is the basic pattern, is transferred onto a resist, the transfer pattern shown in FIG. 3A with a thick line is usually obtained. With the mask-line-width latitude and the exposure latitude being fixed, the

TABLE 1

| EXAMPLE | 1 | | |
|---|---|---|---|
| EXPOSURE CONDITIONS | | | |
| WAVE LENGTH OF EXPOSURE LIGHT | 365 nm | | |
| NA | 0.57 | | |
| σ | 0.6 | | |
| SPECIFIED LATITUDE | | | |
| MASK-LINE-WIDTH LATITUDE | 0.00 μm | ±0.05 μm | ±0.05 μm |
| EXPOSURE LATITUDE | 0.0% | ±5.0% | ±10.0% |
| DEPTH OF FOCUS | — | — | — |
| LATITUDE TO BE OBTAINED | DEPTH OF FOCUS | DEPTH OF FOCUS | DEPTH OF FOCUS |
| EVALUATION PATTERNS | FIG. 2A–2E | FIG. 2A–2E | FIG. 2A–2E |
| MEASUREMENT-POINT COORDINATE Pi | | | |
| 0.00–0.80 μm | (A) ≈ (B) ≈ (C) ≈ (D) ≈ (E) | (A) ≈ (B) ≈ (C) ≈ (D) ≈ (E) | (A) ≈ (B) ≈ (C) ≈ (D) ≈ (E) |
| 0.80–1.20 μm | (E) < (A) ≈ (B) ≈ (C) ≈ (D) | (E) < (A) ≈ (B) ≈ (C) ≈ (D) | (E) < (A) ≈ (B) ≈ (C) ≈ (D) |
| 1.20–1.40 μm | (A) < (B) ≈ (C) ≈ (D) ≈ (E) | (A) ≈ (D) < (B) ≈ (C) ≈ (E) | (A) < (B) ≈ (C) ≈ (D) ≈ (E) |
| REFERENCED FIGURE | FIG. 4 | FIG. 5 | FIG. 6 |

EXAMPLE 2

In example 1, with the pattern widths of the transfer patterns obtained from evaluation patterns A to E, shown in FIGS. 2A to 2E, the shapes of the patterns formed on a photomask were evaluated. In contrast, with the shapes of the tip portions of the transfer patterns obtained from evaluation patterns A to E, shown in FIGS. 2A to 2E, the shapes of the patterns formed on a photomask were evaluated in example 2.

The same exposure condition as that used in example 1 was used in example 2. Among three kinds of latitude, mask-line-width latitude, exposure latitude, and the depth of distance from the virtual reference line on the transfer pattern corresponding to that on an evaluation pattern to the position on the transfer pattern corresponding to a measurement point ($Q_1$ for example) changes as the defocusing value changes. The relationship between the variation ($\Delta L$) of the distance and the variation of the defocusing value has the same tendency as that typically shown in FIG. 3B with the variation of the pattern width being changed to that of the distance.

According to the obtained sizes of the transfer patterns (the distances described above), the minimum value of the quantity (defocusing value in example 2) corresponding to one latitude which was not specified (the depth of focus in example 2) was obtained within the other two kinds of latitude, which were specified, (mask-line-width latitude and exposure latitude) at each measurement point for each of evaluation patterns A to E, shown in FIGS. 2A to 2E. In other words, the defocusing values were obtained at each measurement point when variation in the distance (ΔL) equals ±10% of the target value. Then, the minimum value of variation in the defocusing values at each measurement point was regarded as latitude to be obtained at each measurement point (the depth of focus in example 2). This latitude was obtained for each of evaluation patterns A to E.

For each evaluation pattern, with two kinds of latitude, the mask-line-width latitude and the exposure latitude, being set to 0.00 μm and 0.0%, and ±0.05 μm and ±5.0%, one latitude which was not specified at each measurement point (the depth of focus in example 2) was expressed as a function of the positions of a series of a multiple of measurement points specified in advance on each evaluation pattern. FIGS. 7A and 7B show such functions (five curves) for the depth of focus (unit: μm) with the positions of the measurement points being set along the horizontal axis. Since the depth of focus was obtained in example 2 in the same way as in example 1, detailed description is omitted here. Table 2, below, shows evaluation of the depth of focus based on FIGS. 7A and 7B.

From the evaluation results in example 2, evaluation pattern B, shown in FIG. 2B, has the largest depth of focus among the evaluation patterns shown in FIG. 2 and is the most appropriate. The evaluation results in examples 1 and 2 were examined overall and it was also found that evaluation pattern B has the largest depth of focus.

the depth of focus, were set to 0.00 μm and 0.0 μm, and ±0.05 μm and ±0.50 μm. With the mask line width being changed to 100±m'X', where m' is 0, 1, 2, . . . , 50 and X' is 1.0%, the transfer pattern corresponding to each evaluation pattern was obtained by simulation.

The sizes of a transfer pattern (pattern widths of each transfer pattern in example 3) were obtained at the positions corresponding to a plurality of measurement points specified in advance on each of the evaluation patterns, in the same way as in example 1.

According to the obtained sizes of the transfer patterns, the minimum value of the quantity (the amount of exposure in example 3) was obtained within two specified kinds of latitude (mask-line-width latitude and the depth of focus) for each of evaluation patterns A to E, shown in FIGS. 2A to 2E, in the same way as in example 1. The minimum value was regarded as not-specified latitude (the exposure latitude in example 3).

Figure 8A:
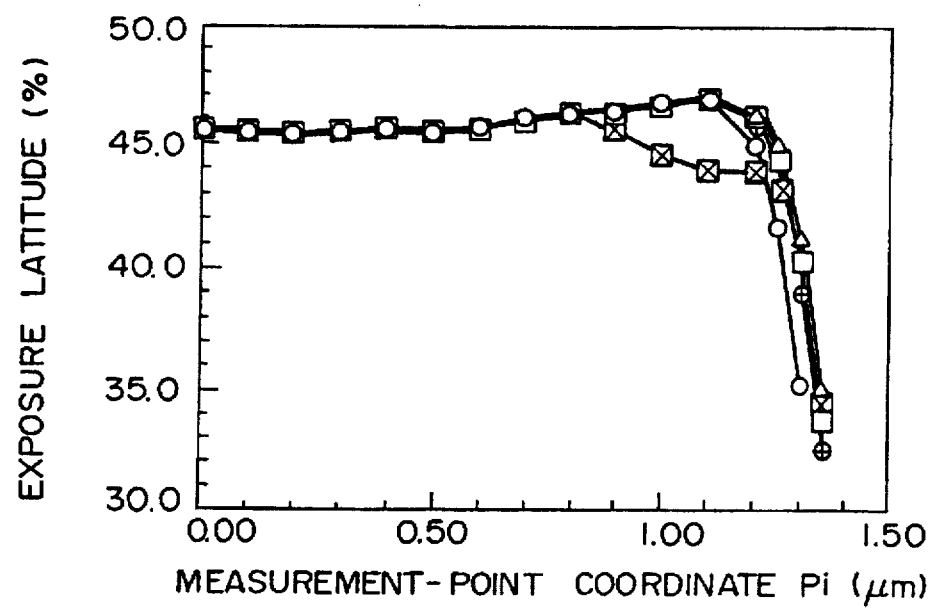
FIGS. 8A and 8B show graphs indicating evaluation results for the exposure latitude in example 3.
Figure 8B:
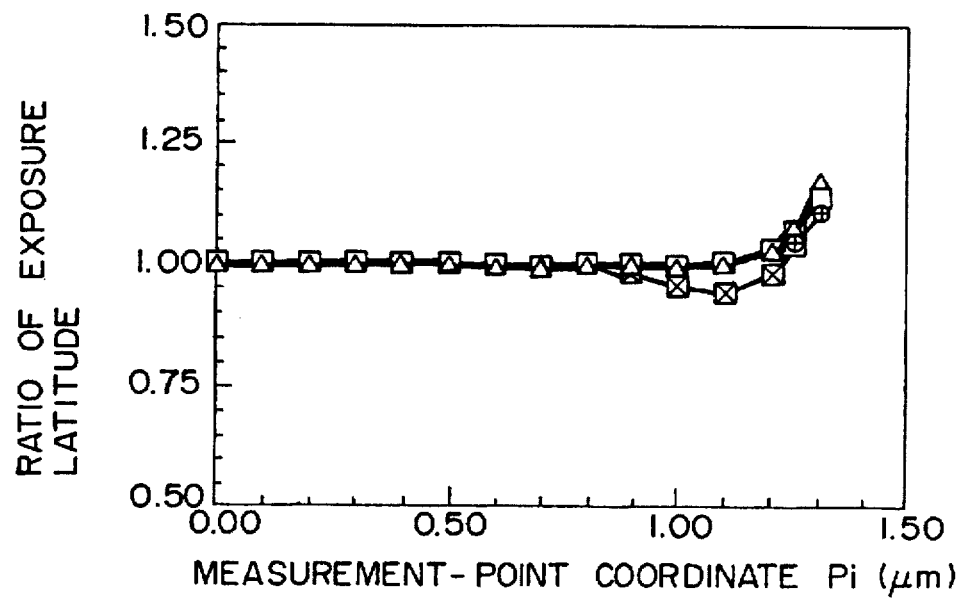
Figure 9A:
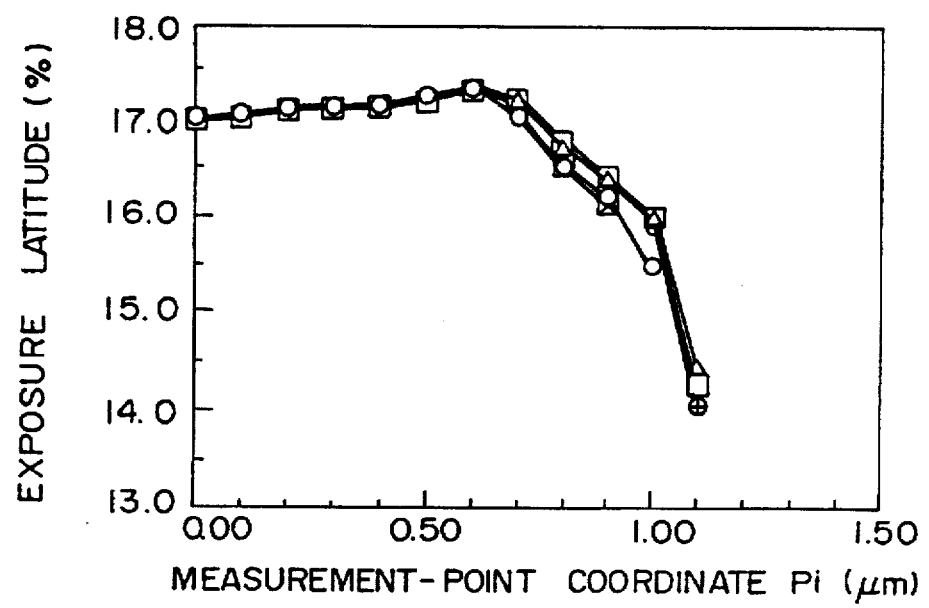
FIGS. 9A and 9B show graphs indicating evaluation results for the exposure latitude in example 3.
Figure 9B:
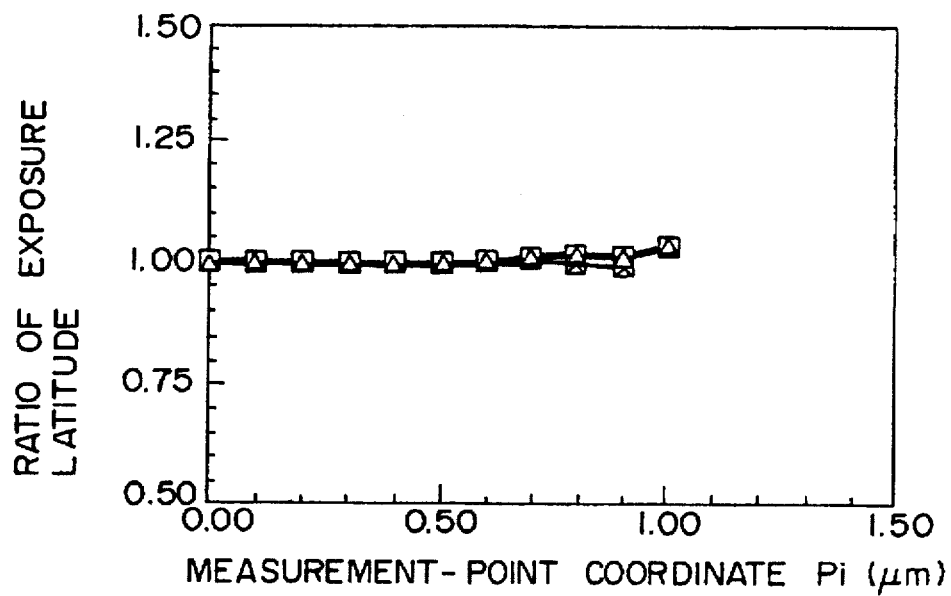

For each evaluation pattern, one latitude which was not specified at each measurement point (the exposure latitude in example 3) was expressed as a function of the positions of a series of a multiple of measurement points ($P_0$ to $P_n$) specified in advance on each evaluation pattern. FIGS. 8A and 9A show such functions (five curves) for the exposure latitude (unit: %) with the positions of the measurement points being set along the horizontal axis. FIGS. 8B and 9B show the functions (four curves) of the value of (the exposure latitude for evaluation patterns B to E)/(the exposure latitude for evaluation pattern A), which is the ratio of the exposure latitude. FIGS. 8A and 8B show cases in which the mask-line-width latitude and the depth of focus were set to

TABLE 2

| EXAMPLE | 2 | |
| --- | --- | --- |
| EXPOSURE CONDITIONS | | |
| WAVE LENGTH OF EXPOSURE LIGHT | 365 nm | |
| NA | 0.57 | |
| σ | 0.6 | |
| SPECIFIED LATITUDE | | |
| MASK-LINE-WIDTH LATITUDE | 0.00 μm | ±0.05 μm |
| EXPOSURE LATITUDE | 0.0% | ±5.0% |
| DEPTH OF FOCUS | — | — |
| LATITUDE TO BE OBTAINED | DEPTH OF FOCUS | DEPTH OF FOCUS |
| EVALUATION PATTERNS | FIG. 2A–2E (A) < (C) ≈ (D) ≈ (E) < (B) | FIG. 2A–2E (A) < (C) ≈ (D) ≈ (E) < (B) |
| REFERENCED FIGURE | FIG. 7A | FIG. 7B |

EXAMPLE 3

Example 3 is a modified example of example 1. Also in example 3, with the pattern widths of the transfer patterns obtained from evaluation patterns A to E, shown in FIGS. 2A to 2E, the shapes of the patterns formed on a photomask were evaluated. The same exposure condition as that used in example 1 was used in example 3.

The mask-line-width latitude and the exposure latitude were specified in example 1. With a defocusing value being changed, the transfer pattern corresponding to each evaluation pattern was obtained by simulation.

In contrast, in example 3, among three kinds of latitude, mask-line-width latitude, exposure latitude, and the depth of focus, two kinds of latitude, the mask-line-width latitude and 0.00 μm and 0.0 μm, and FIGS. 9A and 9B show cases in which the mask-line-width latitude and the depth of focus were set to ±0.05 μm and ±0.50 μm.

The obtained latitude for the evaluation patterns is compared with each other to evaluate the shapes of the evaluation patterns. In example 3, the latitude for the basic pattern, shown in FIG. 2A, was compared with the latitude for the other evaluation patterns to select the evaluation pattern having the largest exposure latitude as a pattern to be actually formed on a photomask. It is preferable to compare the magnitude of the one not-specified latitude in the obtained function by the whole function, shown in FIGS. 8A, 8B, 9A and 9B. According to FIGS. 8A, 8B, 9A, and 9B, Table 3 shows the results of evaluation for the exposure latitude.

From the evaluation results in example 3, it was found that evaluation patterns B, C, and D, shown in FIGS. 2B, 2C, and 2D, have the largest exposure latitude among the evaluation patterns.

For each evaluation pattern, one latitude which was not specified at each measurement point (the mask-line-width latitude in example 4) was expressed as a function of the positions of a series of a multiple of measurement points ($P_0$

TABLE 3

| EXAMPLE | 3 | |
| --- | --- | --- |
| EXPOSURE CONDITIONS | | |
| WAVE LENGTH OF EXPOSURE LIGHT | 365 nm | |
| NA | 0.57 | |
| σ | 0.6 | |
| SPECIFIED LATITUDE | | |
| MASK-LINE-WIDTH LATITUDE | 0.00 μm | ±0.05 μm |
| EXPOSURE LATITUDE | — | — |
| DEPTH OF FOCUS | 0.00 μm | ±0.50 μm |
| LATITUDE TO BE OBTAINED | EXPOSURE LATITUDE | EXPOSURE LATITUDE |
| EVALUATION PATTERNS | FIG. 2A–2E | FIG. 2A–2E |
| MEASUREMENT-POINT COORDINATE Pi | | |
| 0.00–0.80 μm | (A) ≈ (B) ≈ (C) ≈ (D) ≈ (E) | |
| 0.80–1.20 μm | (E) < (A) ≈ (B) ≈ (C) ≈ (D) | |
| 1.20–1.40 μm | (A) < (B) ≈ (C) ≈ (D) ≈ (E) | |
| 0.00–0.60 μm | | (A) ≈ (B) ≈ (C) ≈ (D) ≈ (E) |
| 0.60–1.10 μm | | (A) ≈ (E) < (B) ≈ (C) ≈ (D) |
| REFERENCED FIGURE | FIG. 8 | FIG. 9 |

EXAMPLE 4

Example 4 is a modified example of example 1. Also in example 4, with the pattern widths of the transfer patterns obtained from evaluation patterns A to E, shown in FIGS. 2A to 2E, the shapes of the patterns formed on a photomask were evaluated. The same exposure condition as that used in example 1 was used in example 4.

In example 4, among three kinds of latitude, mask-line-width latitude, exposure latitude, and the depth of focus, two kinds of latitude, the exposure latitude and the depth of focus, were set to 0.0% and 0.0 μm, and ±5.0% and ±0.50 μm. With the size of each evaluation pattern being changed to 0.40±m"X", where m" is 0, 1, 2, . . . , 50 and X" is 0.01 μm, the transfer pattern corresponding to each evaluation pattern was obtained by simulation.

The sizes of a transfer pattern (pattern widths of the transfer pattern in example 4) were obtained at the positions corresponding to a plurality of measurement points specified in advance on each of the evaluation patterns, in the same way as in example 1.

Figure 10A:
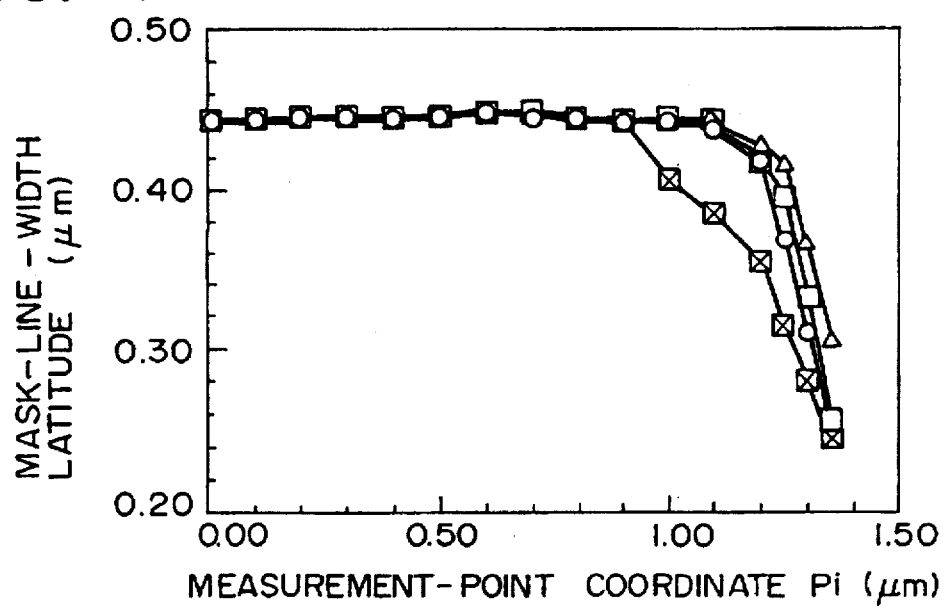
FIGS. 10A and 10B show graphs indicating evaluation results for the mask-line-width latitude in example 4.
Figure 10B:
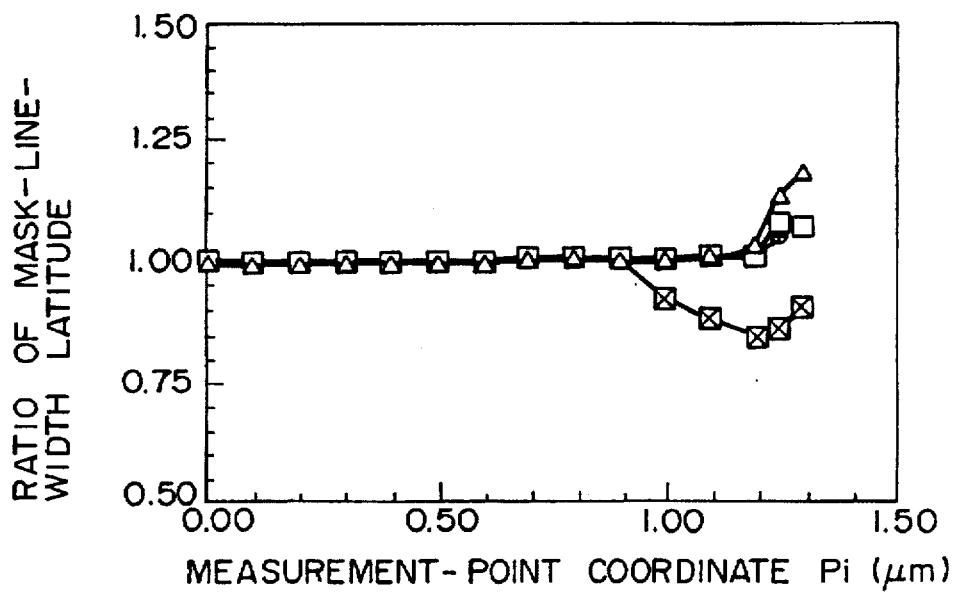
Figure 11A:
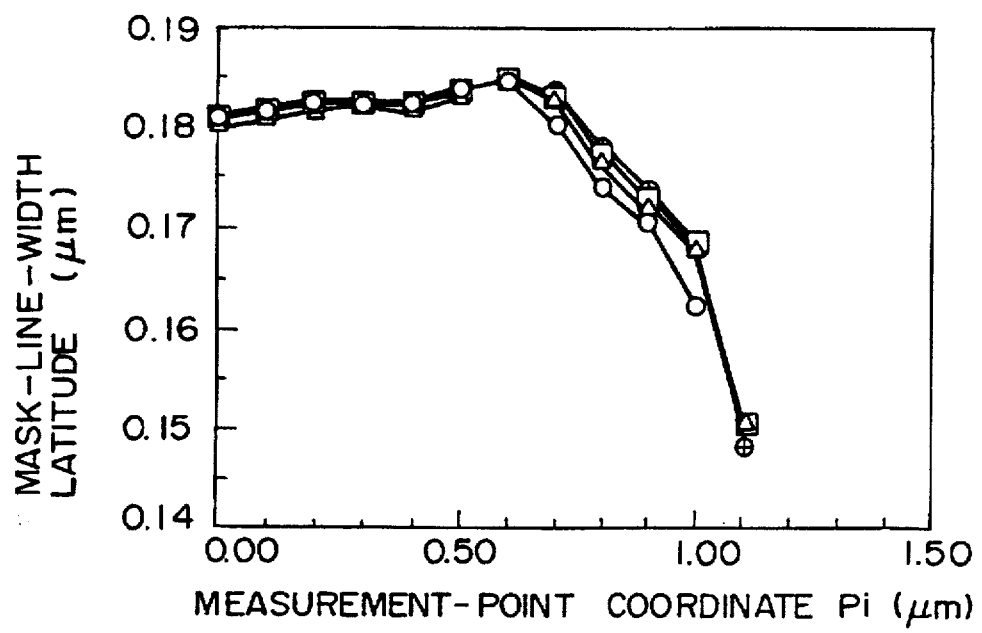
FIGS. 11A and 11B show graphs indicating evaluation results for the mask-line-width latitude in example 4.
Figure 11B:
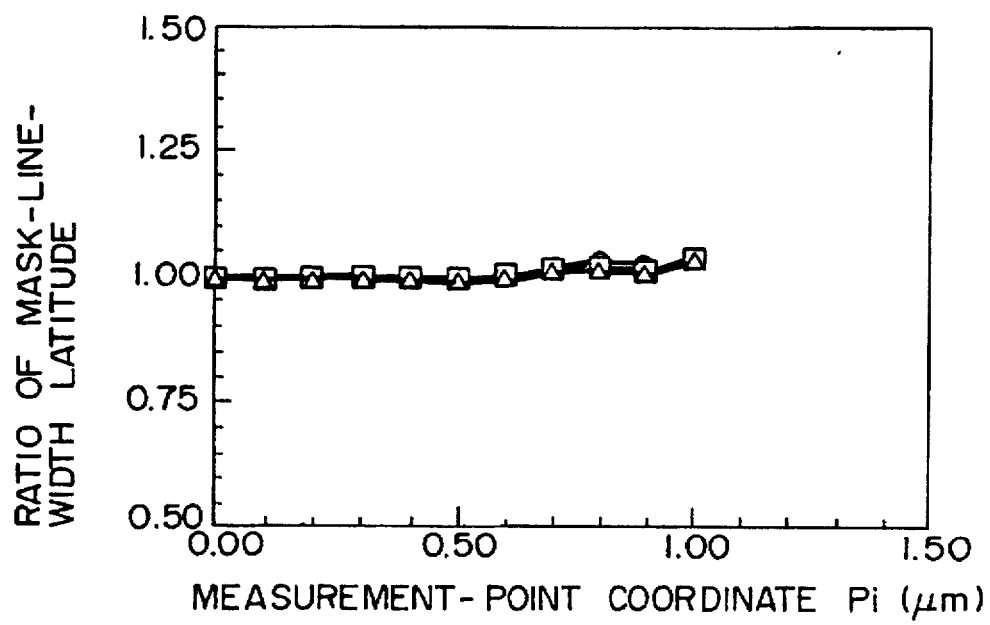

According to the obtained sizes of the transfer patterns, the minimum value of the quantity (the mask line width in example 4) was obtained within two specified kinds of latitude, (exposure latitude and the depth of focus) for each of evaluation patterns A to E, shown in FIGS. 2A to 2E, in the same way as in example 1. The minimum value was regarded as not-specified latitude (the mask-line-width latitude in example 4).

to $P_n$) specified in advance on each evaluation pattern. FIGS. 10A and 11A show such functions (five curves) for the mask-line-width latitude (unit: μm) with the positions of the measurement points being set along the horizontal axis. FIGS. 10B and 11B show the functions (four curves) of the value of (the mask-line-width latitude for evaluation patterns B to E)/(the mask-line-width latitude for evaluation pattern A), which is the ratio of the mask-line-width latitude. FIGS. 10A and 10B show cases in which the exposure latitude and the depth of focus were set to 0.00% and 0.0 μm, and FIGS. 11A and 11B show cases in which the exposure latitude and the depth of focus were set to ±5.0% and ±0.50 μm.

The obtained latitude for the evaluation patterns is compared with each other to evaluate the shapes of the evaluation patterns. In example 4, the latitude for the basic pattern, shown in FIG. 2A, was compared with the latitude for the other evaluation patterns to select the evaluation pattern having the largest mask-line-width latitude as a pattern to be actually formed on a photomask. It is preferable to compare the magnitude of the one not-specified latitude in the obtained function by the whole function, shown in FIGS. 10A, 10B, 11A and 11B. According to FIGS. 10A, 10B, 11A, and 11B, Table 4 shows the results of evaluation for the mask-line-width latitude.

From the evaluation results in example 4, it was found that evaluation pattern B, shown in FIG. 2B, has the largest mask-line-width latitude among the evaluation patterns.

TABLE 4

| EXAMPLE | 4 | |
| --- | --- | --- |
| EXPOSURE CONDITIONS | | |
| WAVE LENGTH OF EXPOSURE LIGHT | 365 nm | |
| NA | 0.57 | |
| σ | 0.6 | |
| SPECIFIED LATITUDE | | |
| MASK-LINE-WIDTH LATITUDE | — | — |
| EXPOSURE LATITUDE | 0.0% | ±5.0% |
| DEPTH OF FOCUS | 0.00 μm | ±0.50 μm |
| LATITUDE TO BE OBTAINED | MASK-LINE-WIDTH LATITUDE | MASK-LINE-WIDTH LATITUDE |
| EVALUATION PATTERNS | FIG. 2A–2E | FIG. 2A–2E |
| MEASUREMENT-POINT COORDINATE Pi | | |
| 0.00–0.90 μm | (A) ≈ (B) ≈ (C) ≈ (D) ≈ (E) | |
| 0.90–1.20 μm | (E) << (A) ≈ (B) ≈ (C) ≈ (D) | |
| 1.20–1.40 μm | (E) ≈ (D) << (A) < (C) < (B) | |
| 0.00–0.60 μm | | (A) ≈ (B) ≈ (C) ≈ (D) ≈ (E) |
| 0.60–0.90 μm | | (A) < (B) ≈ (C) ≈ (D) ≈ (E) |
| 0.90–1.10 μm | | (E) << (A) < (B) ≈ (C) ≈ (D) |
| REFERENCED FIGURE | FIG. 10 | FIG. 11 |

With all of the mask-line-width latitude, the exposure latitude, and the depth of focus being taken into account, it was found that evaluation pattern B, shown in FIG. 2B, is the most appropriate from the overall evaluation of the results in examples 1 to 4.

EXAMPLE 5

Figure 12:
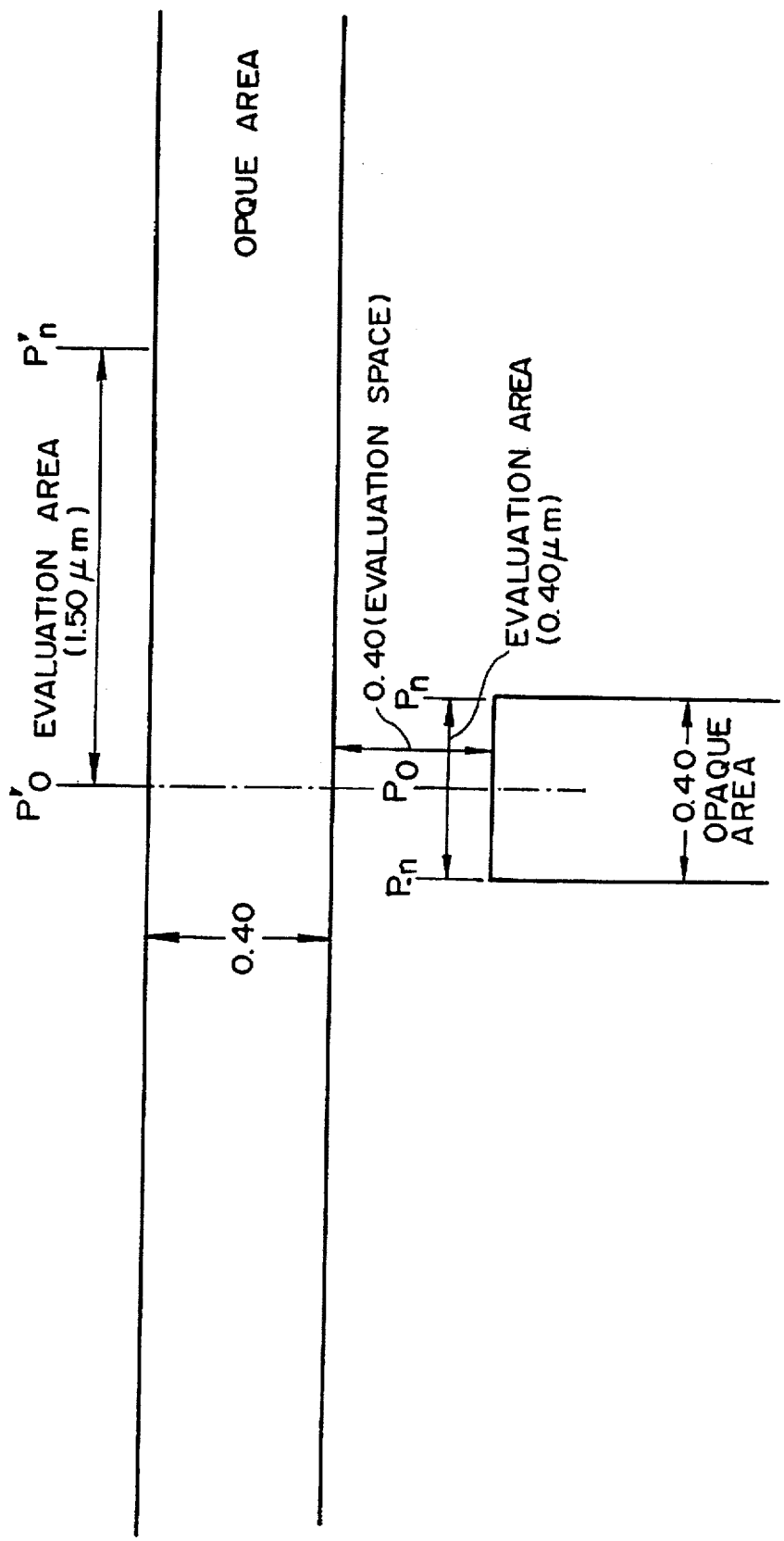
FIG. 12 is a typical plan of an evaluation pattern.

Examples 5 and 6 relate to pattern-shape evaluation methods for usual photomasks having patterns formed with light-transmission areas and opaque areas. In these examples, the evaluation pattern shown in FIG. 12 (unit: μm) was used. Evaluation pattern A, which is the basic pattern shown in FIG. 2A, was disposed separately from an isolated line having a pattern width of 0.40 μm. The distance from the edge of the isolated line to the tip portion of evaluation pattern A was set to 0.40 μm and the edge of the isolated line was parallel to the tip portion of the evaluation pattern A. In example 5, each of evaluation patterns B to E, shown in FIGS. 2B to 2E, was disposed at the same position as evaluation pattern A. With these five evaluation patterns, the shapes of the patterns were evaluated. The evaluation patterns used in examples 5 and 6 comprising combinations of the isolated line and evaluation patterns A to E are named as follows;

Evaluation pattern "a": Isolated line+evaluation pattern A
Evaluation pattern "b": Isolated line+evaluation pattern B
Evaluation pattern "c": Isolated line+evaluation pattern C
Evaluation pattern "d": Isolated line+evaluation pattern D
Evaluation pattern "e": Isolated line+evaluation pattern E In example 5, with the shapes of spaces in the transfer patterns obtained from evaluation patterns A to E, the shapes of the patterns formed on a photomask were evaluated using evaluation patterns "a" to "e".

The same exposure condition as that used in example 1 was used in example 5. Among three kinds of latitude, mask-line-width latitude, exposure latitude, and the depth of focus, two kinds of latitude, the mask-line-width latitude and the exposure latitude, were set to 0.00 μm and 0.0%, and ±0.05 μm and ±5.0% in example 5.

The mask-line-width latitude and the exposure latitude were specified in example 5. With a defocusing value being changed, the transfer pattern corresponding to each evaluation pattern was obtained by simulation. The defocusing value changed in the same way as for example 1.

The sizes of portions corresponding to evaluation patterns A to E in evaluation patterns "a" to "e" were obtained at the positions corresponding to a plurality of measurement points ($P_{-n}$ to $P_n$) specified in advance on each of evaluation patterns "a" to "e", in the same way as in example 1.

According to the obtained sizes (the distances described above) of the transfer patterns, the minimum value of the quantity (the defocusing value in example 5) was obtained as not-specified latitude (the depth of focus in example 5) within two specified kinds of latitude (mask-line-width latitude and the exposure latitude) at each measurement point for each of the portions corresponding to evaluation patterns A to E in evaluation patterns "a" to "e" in the same way as in example 1.

With two kinds of latitude, the mask-line-width latitude and the exposure latitude, being set to 0.00 μm and 0.0%, and ±0.05 μm and ±5.0%, for each evaluation pattern, one latitude which was not specified at each measurement point (the depth of focus in example 5) was expressed as a function of the positions of a series of a multiple of measurement points ($P_{-n}$ to $P_n$) specified in advance on each evaluation pattern. FIGS. 13A and 13B show such functions (four curves) for the depth of focus (unit: μm) with the positions of the measurement points being set along the horizontal axis. Since the depth of focus in example 5 can be obtained in the same way as in example 1, detailed descriptions are omitted here. According to FIGS. 13A and 13B, Table 5 shows the results of evaluation for the depth of focus. For evaluation pattern "a", when the mask-line-width latitude and the exposure latitude were set to 0.00 μm and 0.0%, a successful transfer pattern was not obtained at all. For evaluation patterns "a", "c", and "e", when the mask-line-width latitude and the exposure latitude were set to ±0.05 μm and ±5.0%, a successful transfer pattern was not obtained at all.

From the evaluation results in example 5, it was found that evaluation patterns "b" and "d", which include the evaluation patterns shown in FIGS. 2B and 2D, have the largest depth of focus among the evaluation patterns.

TABLE 5

| EXAMPLE | 5 | |
|---|---|---|
| EXPOSURE CONDITIONS | | |
| WAVE LENGTH OF EXPOSURE LIGHT | 365 nm | |
| NA | 0.57 | |
| σ | 0.6 | |
| SPECIFIED LATITUDE | | |
| MASK-LINE-WIDTH LATITUDE | 0.00 μm | ±0.05 μm |
| EXPOSURE LATITUDE | 0.0% | ±5.0% |
| DEPTH OF FOCUS | — | — |
| LATITUDE TO BE OBTAINED | DEPTH OF FOCUS | DEPTH OF FOCUS |
| EVALUATION PATTERNS | FIG. 12 AND FIG. 2A–2E (e) < (c) < (b) < (d) | FIG. 12 AND FIG. 2A–2E (d) < (b) |
| REFERENCED FIGURE | FIG. 13 | FIG. 13 |

EXAMPLE 6

In example 5, with the shapes of spaces in the transfer patterns obtained from the portions corresponding to the evaluation patterns shown in FIGS. 2A to 2E, the shapes of the patterns formed on a photomask were evaluated using evaluation patterns "a" to "e". In contrast, with the width of the isolated line in each of evaluation patterns "a" to "e", the shapes of the patterns formed on a photomask were evaluated in example 6.

The same exposure condition as that used in example 1 was used in example 6. Among three kinds of latitude, mask-line-width latitude, exposure latitude, and the depth of focus, two kinds of latitude, the mask-line-width latitude and the exposure latitude, were set to 0.00 μm and 0.0%, ±0.05 μm and ±5.0%, and ±0.05 μm and ±10.0% in example 6.

The mask-line-width latitude and the exposure latitude were specified in example 6. With a defocusing value being changed, the transfer pattern corresponding to each evaluation pattern was obtained by simulation. The defocusing value changed in the same way as for example 1.

The sizes of portions (those corresponding to the isolated lines) in a transfer pattern were obtained at the positions corresponding to a plurality of measurement points ($P'_0$ to $P'_n$) specified in advance on each of evaluation patterns "a" to "e", in the same way as in example 1. Measurement point $P'_0$ is disposed on the center line of each of evaluation patterns A to E, shown in FIG. 2A to 2E. The sizes of portions (widths of the portions corresponding to the isolated line on a transfer pattern in example 6) in a transfer pattern were obtained at the positions corresponding to 16 measurement points, $P'_0$ to $P'_n$, disposed within a distance of 1.50 μm on each of evaluation patterns at an interval of 0.1 μm.

According to the obtained sizes (the widths of the transfer patterns described above) of the transfer patterns, the minimum value of the quantity (the defocusing value in example 6) was obtained as not-specified latitude (the depth of focus in example 6) within two specified kinds of latitude (mask-line-width latitude and the exposure latitude) at each measurement point for each of the portions on the transfer patterns corresponding to the isolated lines in evaluation patterns "a" to "e" in the same way as in example 1.

With two kinds of latitude, the mask-line-width latitude and the exposure latitude, being set to 0.00 μm and 0.0%, ±0.05 μm and ±5.0%, and ±0.05 μm and ±10.0%, for each evaluation pattern, one latitude which was not specified at each measurement point (the depth of focus in example 6) was expressed as a function of the positions of a series of a multiple of measurement points ($P'_0$ to $P'_n$) specified in advance on each evaluation pattern. FIGS. 14A, 14B, and 15 show such functions (five curves) for the depth of focus (unit: μm) with the positions of the measurement points being set along the horizontal axis. Since the depth of focus in example 6 can be obtained in the same way as in example 1, detailed descriptions are omitted here. According to FIGS. 14A, 14B, and 15, Table 6 shows the results of evaluation for the depth of focus.

From the evaluation results in example 6, it was found that evaluation pattern "d", which includes evaluation pattern D, shown in FIG. 2D, has the largest depth of focus among the evaluation patterns. From the overall evaluation of the results in examples 5 and 6, it was found that evaluation pattern "d", which includes evaluation pattern D, shown in FIG. 2D, is the most appropriate.

TABLE 6

| EXAMPLE | 6 | | |
|---|---|---|---|
| EXPOSURE CONDITIONS | | | |
| WAVE LENGTH OF EXPOSURE LIGHT | 365 nm | | |
| NA | 0.57 | | |
| σ | 0.6 | | |
| SPECIFIED LATITUDE | | | |
| MASK-LINE-WIDTH LATITUDE | 0.00 μm | ±0.05 μm | ±0.05 μm |
| EXPOSURE LATITUDE | 0.0% | ±5.0% | ±10.0% |
| DEPTH OF FOCUS | — | — | — |
| LATITUDE TO BE OBTAINED | DEPTH OF FOCUS | DEPTH OF FOCUS | DEPTH OF FOCUS |
| EVALUATION PATTERNS | FIG. 12 AND FIG. 2A–2E | FIG. 12 AND FIG. 2A–2E | FIG. 12 AND FIG. 2A–2E |

TABLE 6-continued

| EXAMPLE | 6 | | |
|---|---|---|---|
| MEASUREMENT-POINT COORDINATE P'i | | | |
| 0.00–0.50 μm | (a) ≈ (e) < (b) < (c) << (d) | | |
| 0.50–1.50 μm | (a) ≈ (b) ≈ (c) ≈ (d) ≈ (e) | | |
| 0.00–0.30 μm | | (e) < (b) < (a) ≈ (c) << (d) | |
| 0.30–1.50 μm | | (a) ≈ (b) ≈ (c) ≈ (d) ≈ (e) | |
| 0.00–0.30 μm | | | (e) < (b) < (c) < (a) << d) |
| 0.30–0.50 μm | | | (b) < (c) ≈ (d) ≈ (e) << (a) |
| 0.50–1.50 μm | | | (a) ≈ (b) ≈ (c) ≈ (d) ≈ (e) |
| REFERENCED FIGURE | FIG. 14A | FIG. 14B | FIG. 15 |

EXAMPLE 7

Figure 16:
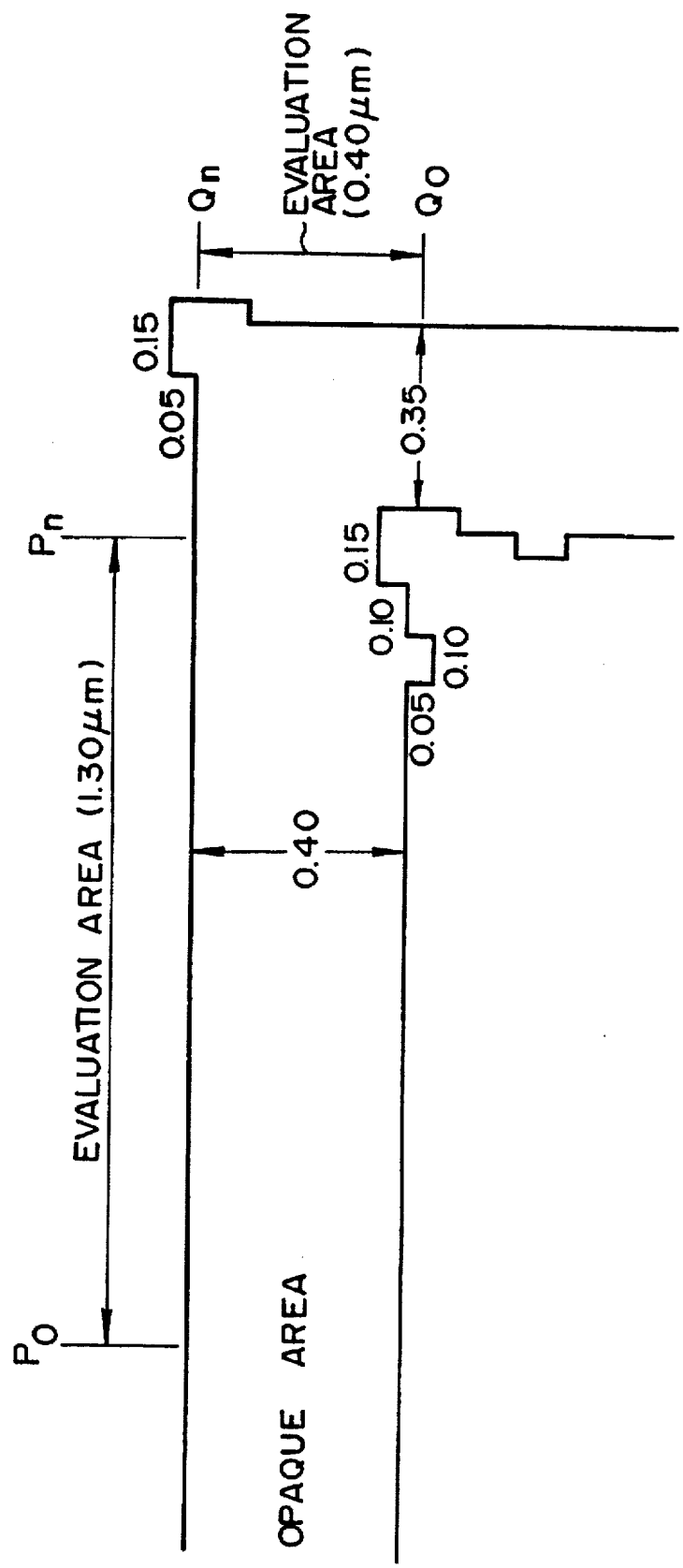
FIG. 16 is a typical plan of an evaluation pattern.

Examples 7 and 8 relate to pattern-shape evaluation methods for usual photomasks having patterns formed with light-transmission areas and opaque areas. In these examples, the evaluation pattern shown in FIG. 16 (unit: μm) was used. The evaluation pattern comprises two straight-line patterns extending in directions perpendicular to each other with a width of 0.40 μm and a right-angled corner combining these two straight-line patterns. At the corner and in the vicinity of the corner in the straight-line patterns, the widths of the evaluation pattern are widened and narrowed in order to compensating for the optical proximity effect, as shown in FIG. 16. This evaluation pattern is called a corrected evaluation pattern. An evaluation pattern having no portions widened or narrowed in order to compensate for the optical proximity effect is called an uncorrected evaluation pattern. The uncorrected evaluation pattern has two straight-line patterns with a width of 0.40 μm intersected at the corner with an angle of 90 degrees. The shape of the corrected evaluation pattern was determined according to various pieces of information.

In example 7, with the width of the transfer pattern obtained from the straight-line portions in the corrected evaluation pattern and the uncorrected evaluation pattern, the shapes of the patterns formed on a photomask were evaluated.

The same exposure condition as that used in example 1 was used in example 7. Among three kinds of latitude, mask-line-width latitude, exposure latitude, and the depth of focus, two kinds of latitude, the mask-line-width latitude and the exposure latitude, were set to 0.00 μm and 0.0%, ±0.05 μm and ±5.0%, and ±0.05 μm and ±10.0% in example 7.

The mask-line-width latitude and the exposure latitude were specified in example 7. With a defocusing value being changed, the transfer pattern corresponding to each evaluation pattern was obtained by simulation. The defocusing value changed in the same way as for example 1. Measurement points $P_0$ to $P_n$ were disposed within a distance of 1.30 μm on a straight-line pattern. Measurement point $P_n$ was disposed on the line extended from the inner edge of the other straight-line pattern.

The sizes of portions in the transfer pattern were obtained at the positions corresponding to a plurality of measurement points ($P_0$ to $P_n$) specified in advance on each of the corrected evaluation pattern and the uncorrected evaluation pattern in the same way as in example 1.

According to the obtained sizes (corresponding to the widths of the transfer patterns) of the transfer patterns, the minimum value of the quantity (the defocusing value in example 7) was obtained as not-specified latitude (the depth of focus in example 7) within two specified kinds of latitude (mask-line-width latitude and the exposure latitude) at each measurement point for each of the transfer patterns based on the corrected evaluation pattern and uncorrected evaluation pattern in the same way as in example 1.

Figure 17A:
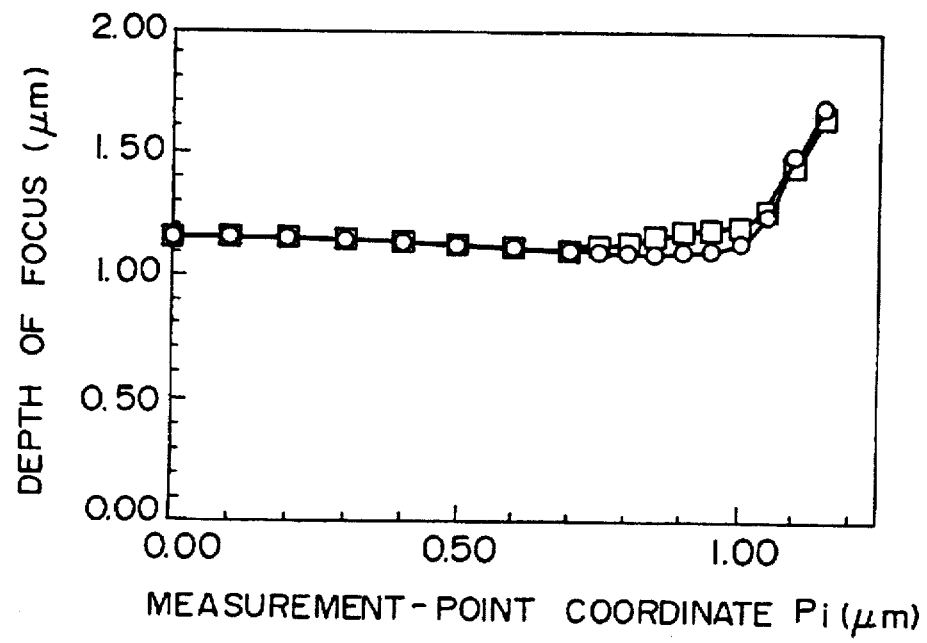
FIGS. 17A and 17B show graphs indicating evaluation results for the depth of focus in example 7.
Figure 17B:
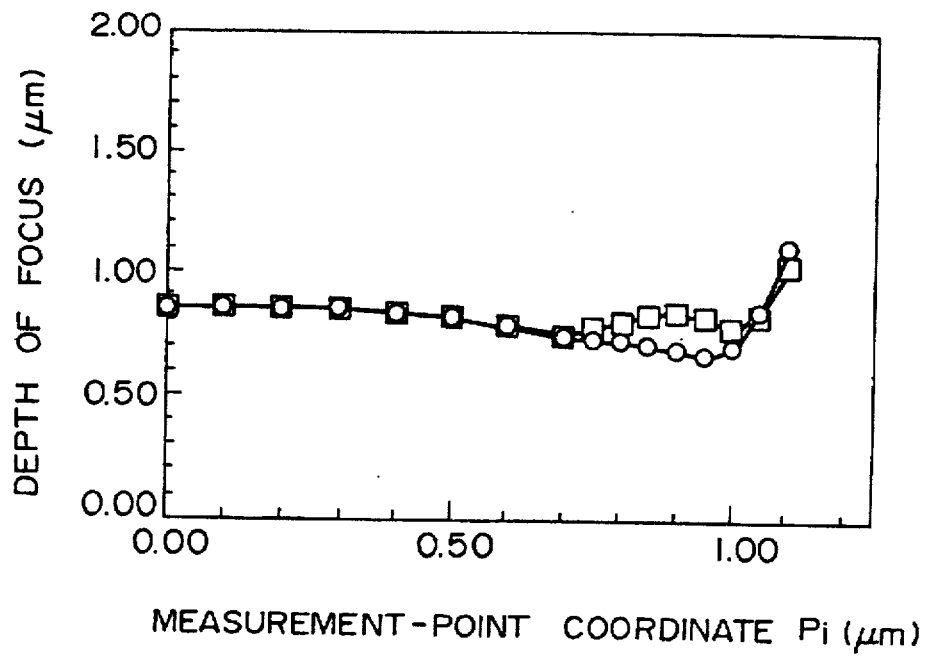
Figure 18:
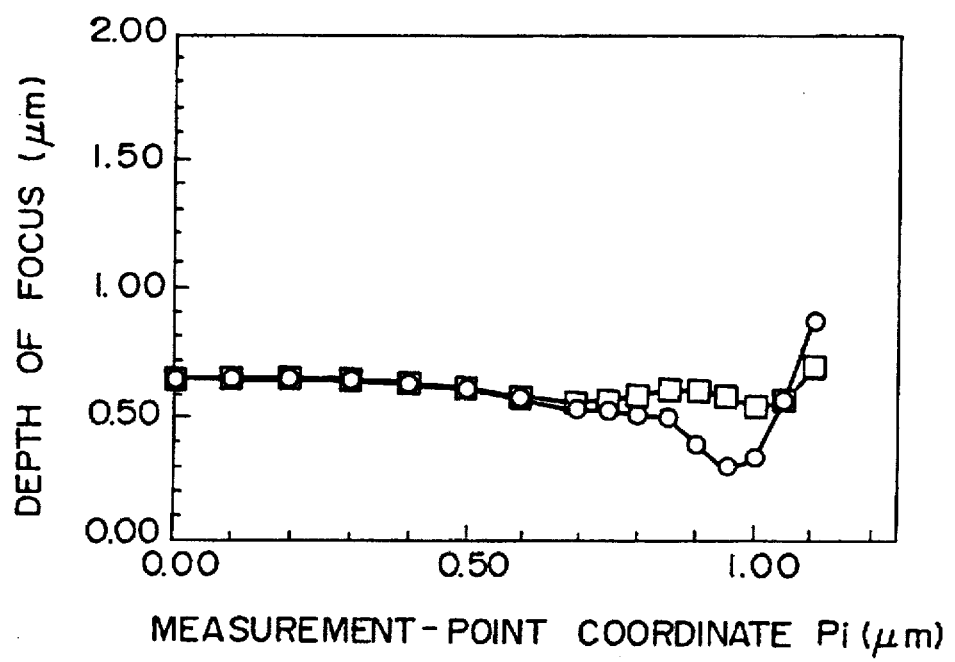
FIG. 18 shows a graph indicating evaluation results for the depth of focus in example 7.

With two kinds of latitude, the mask-line-width latitude and the exposure latitude, being set to 0.00 μm and 0.0%, ±0.05 μm and ±5.0%, and ±0.05 μm and ±10.0%, for each evaluation pattern, one latitude which was not specified at each measurement point (the depth of focus in example 7) was expressed as a function of the positions of a series of a multiple of measurement points ($P_0$ to $P_n$) specified in advance on each evaluation pattern. FIGS. 17A, 17B, and 18 show such functions (two curves) for the depth of focus (unit: μm) with the positions of the measurement points being set along the horizontal axis. Since the depth of focus in example 7 can be obtained in the same way as in example 1, detailed descriptions are omitted here. According to FIGS. 17A, 17B, and 18, Table 7 shows the results of evaluation for the depth of focus.

From the evaluation results in example 7, it was found that the corrected evaluation pattern has a larger depth of focus.

TABLE 7

| EXAMPLE | 7 | | |
|---|---|---|---|
| EXPOSURE CONDITIONS | | | |
| WAVE LENGTH OF EXPOSURE LIGHT | 365 nm | | |
| NA | 0.57 | | |
| σ | 0.6 | | |
| SPECIFIED LATITUDE | | | |
| MASK-LINE-WIDTH | 0.00 μm | ±0.05 μm | ±0.05 μm |

TABLE 7-continued

| EXAMPLE | 7 | | |
|---|---|---|---|
| LATITUDE | | | |
| EXPOSURE LATITUDE | 0.0% | ±5.0% | ±10.0% |
| DEPTH OF FOCUS | — | — | — |
| LATITUDE TO BE OBTAINED | DEPTH OF FOCUS | DEPTH OF FOCUS | DEPTH OF FOCUS |
| EVALUATION PATTERNS MEASUREMENT-POINT COORDINATE Pi | FIG. 16 | FIG. 16 | FIG. 16 |
| 0.00–0.07 μm | UNCORRECTED ≈ CORRECTED | UNCORRECTED ≈ CORRECTED | UNCORRECTED ≈ CORRECTED |
| 0.07–1.00 μm | UNCORRECTED < CORRECTED | UNCORRECTED < CORRECTED | |
| 1.00–1.20 μm | UNCORRECTED ≈ CORRECTED | | |
| 1.00–1.10 μm | | UNCORRECTED ≈ CORRECTED | |
| 0.70–1.05 μm | | | UNCORRECTED < CORRECTED |
| 1.05–1.10 μm | | | CORRECTED < UNCORRECTED |
| REFERENCED FIGURE | FIG. 17A | FIG. 17B | FIG. 18 |

EXAMPLE 8

The evaluation pattern shown in FIG. 16 was also used in example 8. In example 8, with the shapes of portions in the outer edge of the corner in each of the transfer patterns based on the corrected evaluation pattern and the uncorrected evaluation pattern, the shapes of the patterns formed on a photomask were evaluated.

The same exposure condition as that used in example 1 was used in example 8. Among three kinds of latitude, mask-line-width latitude, exposure latitude, and the depth of focus, two kinds of latitude, the mask-line-width latitude and the exposure latitude, were set to 0.00 μm and 0.0%, and ±0.05 μm and ±5.0% in example 8.

The mask-line-width latitude and the exposure latitude were specified in example 8. With a defocusing value being changed, the transfer pattern corresponding to each evaluation pattern was obtained by simulation. The defocusing value changed in the same way as for example 1. Measurement points $Q_0$ to $Q_n$ were disposed within a distance of 0.40 μm. Measurement points $Q_0$ and $Q_n$ were disposed on the lines extended from the inner and outer edges of one straight-line pattern. A virtual reference line was not shown in the figure.

The sizes (the distances from the virtual reference line shown in FIG. 1C to measurement points $Q_0$ to $Q_n$) of portions in the transfer pattern were obtained at the positions corresponding to a plurality of measurement points ($Q_0$ to $Q_n$) specified in advance on each of the corrected evaluation pattern and the uncorrected evaluation pattern in the same way as in example 1. Only in example 8, the tolerance of variation in the size (variation ΔL in the distance) of the transfer pattern was set to ±5% against the target value.

According to the obtained sizes (the distances from the virtual reference line) of the transfer patterns, the minimum value of the quantity (the defocusing value in example 8) was obtained as not-specified latitude (the depth of focus in example 8) within two specified kinds of latitude (mask-line-width latitude and the exposure latitude) at each measurement point for each of the transfer patterns based on the corrected evaluation pattern and uncorrected evaluation pattern in the same way as in example 1.

Figure 19A:
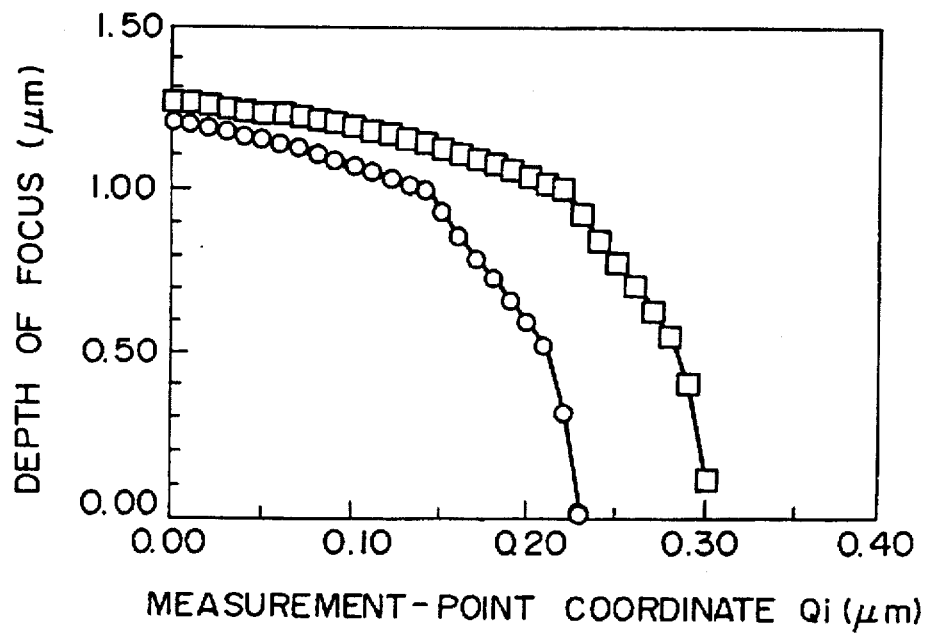
FIGS. 19A and 19B show graphs indicating evaluation results for the depth of focus in example 8.
Figure 19B:
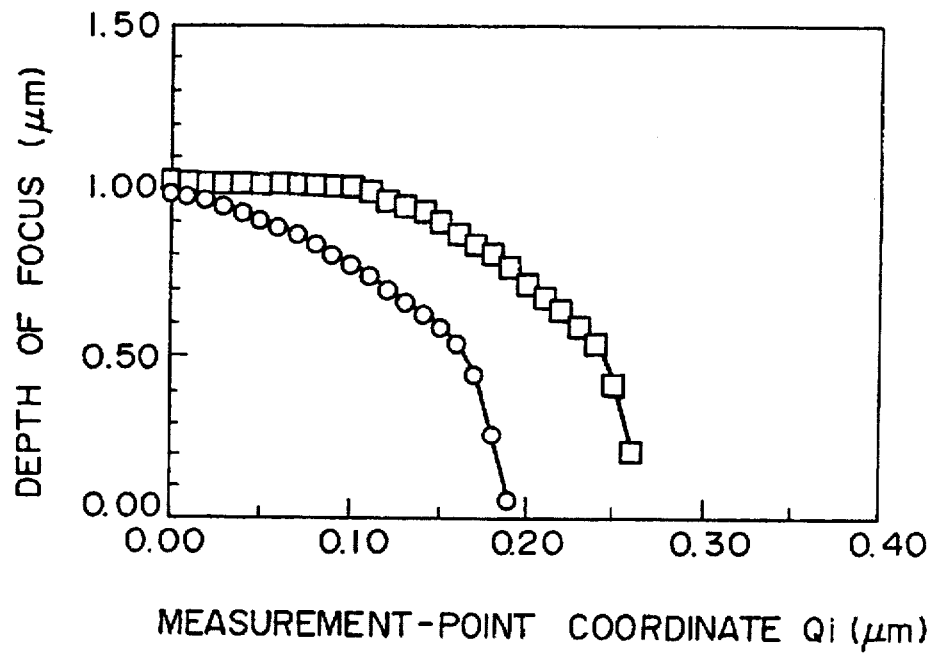

With two kinds of latitude, the mask-line-width latitude and the exposure latitude, being set to 0.00 μm and 0.0%, and ±0.05 μm and ±5.0%, for each evaluation pattern, one latitude which was not specified at each measurement point (the depth of focus in example 8) was expressed as a function of the positions of a series of a multiple of measurement points ($Q_0$ to $Q_n$) specified in advance on each evaluation pattern. FIGS. 19A and 19B show such functions (two curves) for the depth of focus (unit: μm) with the positions of the measurement points being set along the horizontal axis. Since the depth of focus in example 8 can be obtained in the same way as in example 1, detailed descriptions are omitted here. According to FIGS. 19A and 19B, Table 8 shows the results of evaluation for the depth of focus.

From the evaluation results in example 8, it was found that the corrected evaluation pattern has a larger depth of focus. From the overall evaluation of the results in examples 7 and 8, it was found that the corrected evaluation pattern has a larger depth of focus.

TABLE 8

| EXAMPLE | 8 | |
|---|---|---|
| EXPOSURE CONDITIONS | | |
| WAVE LENGTH OF EXPOSURE LIGHT | 365 nm | |
| NA | 0.57 | |
| σ | 0.6 | |
| SPECIFIED LATITUDE | | |
| MASK-LINE-WIDTH LATITUDE | 0.00 μm | ±0.05 μm |
| EXPOSURE LATITUDE | 0.0% | ±5.0% |
| DEPTH OF FOCUS | — | — |

TABLE 8-continued

| EXAMPLE | 8 | |
|---|---|---|
| LATITUDE TO BE OBTAINED | DEPTH OF FOCUS | DEPTH OF FOCUS |
| EVALUATION PATTERNS | FIG. 16 UNCORRECTED < CORRECTED | FIG. 16 UNCORRECTED < CORRECTED |
| REFERENCED FIGURE | FIG. 19A | FIG. 19B |

EXAMPLE 9

Figure 20:
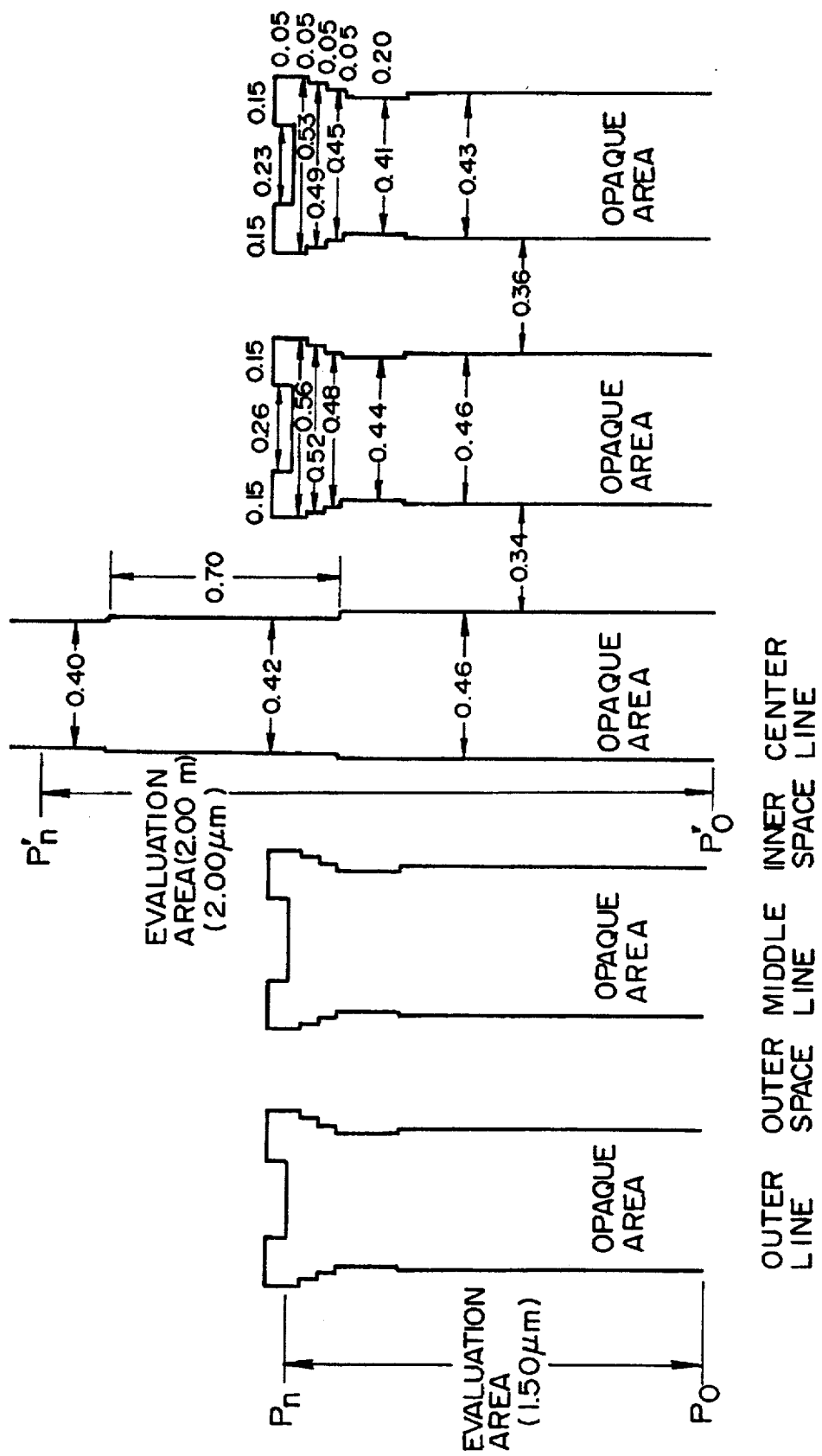
FIG. 20 is a typical plan of an evaluation pattern.

Example 9 relates to a pattern-shape evaluation method for usual photomasks having patterns formed with light-transmission areas and opaque areas. In example 9, an evaluation pattern comprising a center line pattern having a width of 0.40 μm, and intermediate line patterns and outer line patterns both having a width of 0.40 μm and disposed at the right and left of the center line pattern with inner spaces having a width of 0.40 μm between the center line pattern and the intermediate line patterns and with outer spaces having a width of 0.40 μm between the intermediate line patterns and the outer line patterns. FIG. 20 (unit: μm) shows the shape and size of a corrected evaluation pattern which compensates for the optical proximity effect. An uncorrected evaluation pattern which does not compensate for the optical proximity effect comprises a center line pattern having a width of 0.40 μm, intermediate line patterns, and outer line patterns with inner spaces having a width of 0.40 μm and outer spaces with a width of 0.40 μm. The shape of the corrected evaluation pattern was determined according to various pieces of information.

In example 9, with the widths of the patterns and spaces in the transfer patterns obtained from the line patterns and the spaces in the corrected evaluation pattern and the uncorrected evaluation pattern, the shapes of the patterns formed on a photomask were evaluated.

The same exposure condition as that used in example 1 was used in example 9. Among three kinds of latitude, mask-line-width latitude, exposure latitude, and the depth of focus, two kinds of latitude, the mask-line-width latitude and the exposure latitude, were set to 0.00 μm and 0.0%, and ±0.05 μm and ±5.0% in example 9.

The mask-line-width latitude and the exposure latitude were specified in example 9. With a defocusing value being changed, the transfer pattern corresponding to each evaluation pattern was obtained by simulation. The defocusing value changed in the same way as for example 1. Measurement points $P_0$ to $P_n$ for line patterns other than the center line pattern were disposed within a distance of 1.50 μm. Measurement points $P'_0$ to $P'_n$ for the center line pattern were disposed within a distance of 2.00 μm. Measurement points $P_0$ and $P'_0$ were disposed on the same line.

The sizes of portions in the transfer pattern were obtained at the positions corresponding to a plurality of measurement points ($P_0$ to $P_n$ and $P'_0$ to $P'_n$) specified in advance on each of the corrected evaluation pattern and the uncorrected evaluation pattern in the same way as in example 1.

According to the obtained sizes (corresponding to the pattern widths and the space widths) of the transfer patterns, the minimum value of the quantity (the defocusing value in example 9) was obtained as not-specified latitude (the depth of focus in example 9) within two specified kinds of latitude (mask-line-width latitude and the exposure latitude) at each measurement point for each of the transfer patterns based on the corrected evaluation pattern and uncorrected evaluation pattern in the same way as in example 1.

Figure 21:
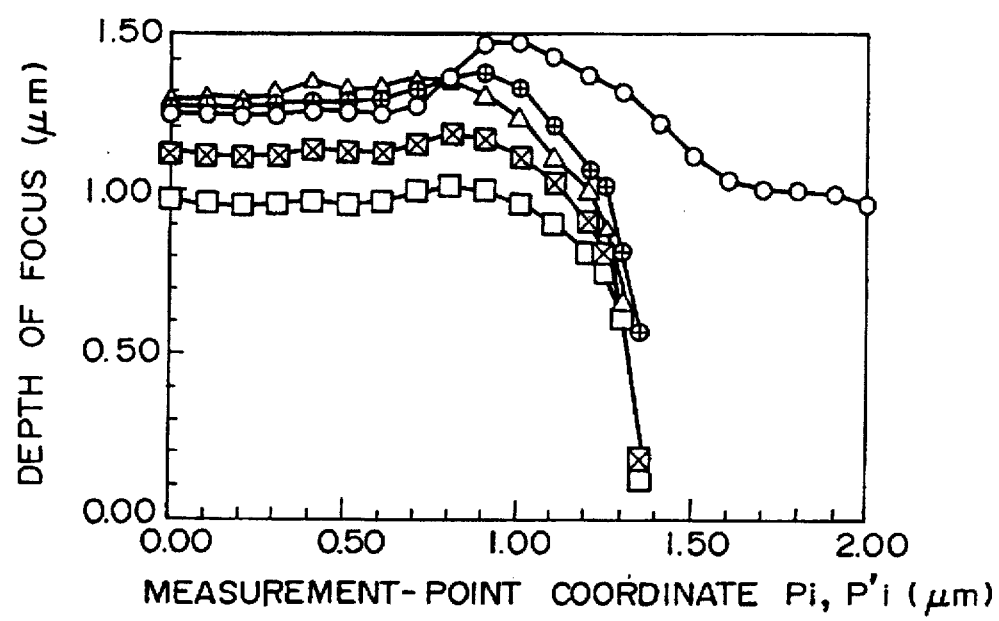
FIG. 21 shows a graph indicating evaluation results for the depth of focus in example 9.

With two kinds of latitude, the mask-line-width latitude and the exposure latitude, being set to 0.00 μm and 0.0%, and ±0.05 μm and ±5.0%, for each evaluation pattern, one latitude which was not specified at each measurement point (the depth of focus in example 9) was expressed as a function of the positions of a series of a multiple of measurement points specified in advance on each evaluation pattern. FIG. 21 shows such functions (five curves) for the depth of focus (unit: μm) with the positions of the measurement points being set along the horizontal axis.

A transfer pattern could not be obtained for the uncorrected evaluation pattern, which did not compensate for the optical proximity effect. Therefore, FIG. 21 shows data only for the corrected evaluation pattern, which compensated for the optical proximity effect. From FIG. 21, it was clear that the optical proximity effect was successfully compensated for in all the evaluation areas in the corrected evaluation pattern.

EXAMPLE 10

In examples 1 to 9, photomasks were configured with patterns formed with usual light-transmission areas and opaque areas. In contrast, in example 10, a so-called half-tone phase-shift photomask having patterns formed with light-transmission areas and opaque areas was used. The transmission factor in the opaque areas was set to 4.00% with the reference of the transmission factor used after a quartz substrate is passed. Exposure light passing through a light-transmission area differed by 180 degrees in phase from that passing through a semiopaque area. Phase error latitude was set to ±5.0 degrees.

Figure 22:
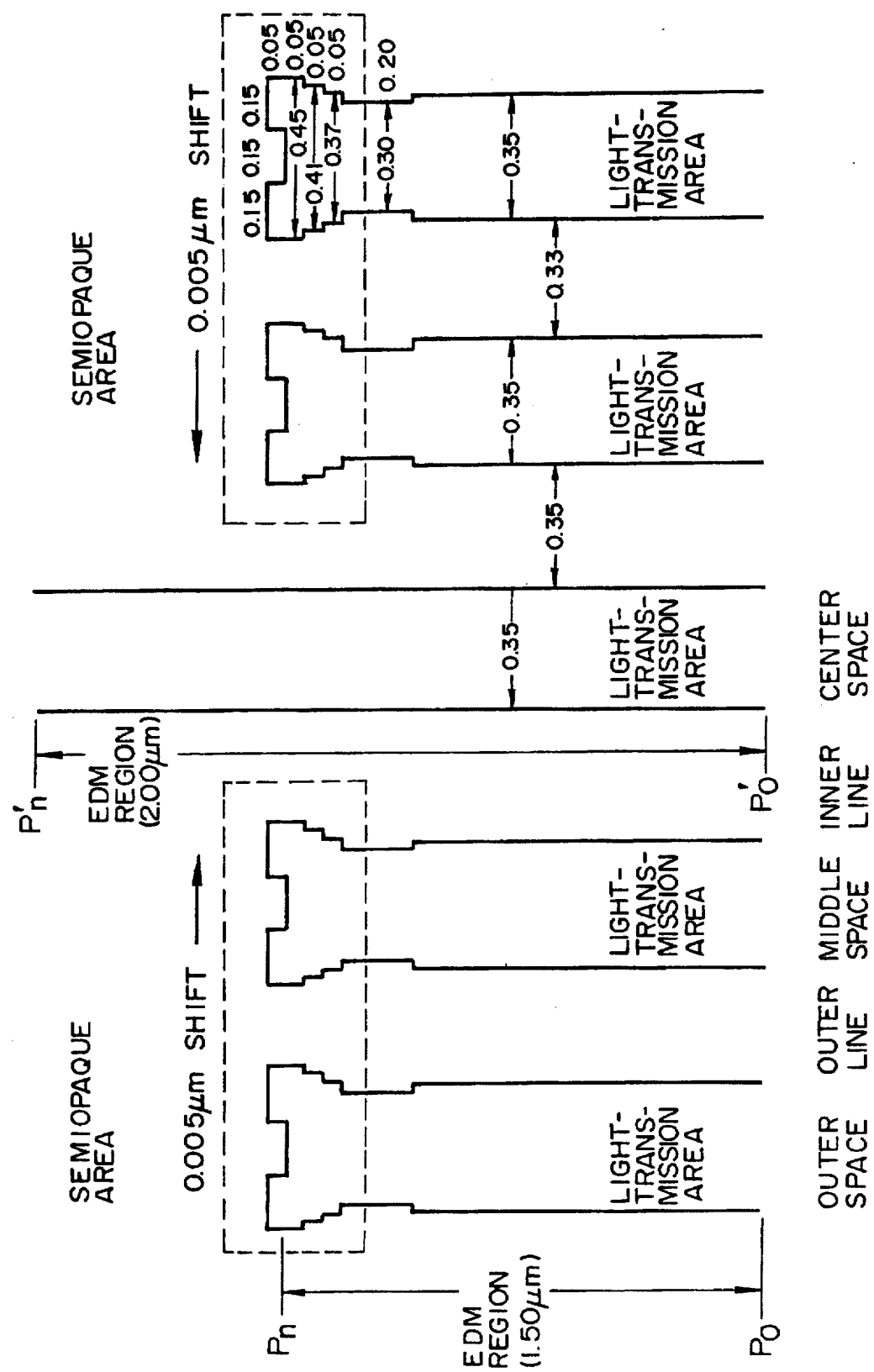
FIG. 22 is a typical plan of an evaluation pattern.

An evaluation pattern formed on a photomask was made such that the corresponding transfer pattern was to be formed with a center space having a width of 0.35 μm and intermediate spaces and outer spaces both having a width of 0.35 μm with inner lines having a width of 0.35 μm disposed between the center space and the intermediate spaces and with outer lines having a width of 0.35 μm disposed between the intermediate spaces and the outer spaces. FIG. 22 (unit: μm) shows the shape and size of a corrected evaluation pattern which compensates for the optical proximity effect. The center lines of the portions enclosed with dotted lines in the evaluation pattern in FIG. 22 shift by 0.005 μm toward the center pattern from those of portions adjacent to the portions enclosed with the dotted lines. An uncorrected evaluation pattern which did not compensate for the optical proximity effect comprised a center space having a width of 0.35 μm, intermediate spaces, and outer spaces with inner lines having a width of 0.35 μm and outer lines with a width of 0.35 μm. The shape of the corrected evaluation pattern was determined according to various pieces of information.

In example 10, with the widths of the patterns and spaces in the transfer patterns obtained from the line patterns and the spaces in the corrected evaluation pattern and the uncorrected evaluation pattern, the shapes of the patterns formed on a photomask were evaluated.

Exposure conditions of NA=0, σ=0.3, and a wavelength of exposure light of 365 nm were used in example 10. Among three kinds of latitude, mask-line-width latitude, exposure latitude, and the depth of focus, two kinds of latitude, the mask-line-width latitude and the exposure latitude, were set to ±0.05 μm and ±5.0% in example 10.

The mask-line-width latitude and the exposure latitude were specified in example 10. With a defocusing value being changed, the transfer pattern corresponding to each evaluation pattern was obtained by simulation. The defocusing value changed in the same way as for example 1. Measurement points $P_0$ to $P_n$ for line patterns other than the center line pattern were disposed within a distance of 1.50 μm. Measurement points $P'_0$ to $P'_n$ for the center line pattern were disposed within a distance of 2.00 μm. Measurement points $P_0$ and $P'_0$ were disposed on the same line.

The sizes of portions in the transfer pattern were obtained at the positions corresponding to a plurality of measurement points ($P_0$ to $P_n$ and $P'_0$ to $P'_n$) specified in advance on each of the corrected evaluation pattern and the uncorrected evaluation pattern in the same way as in example 1.

According to the obtained sizes (corresponding to the pattern widths and the space widths) of the transfer patterns, the minimum value of the quantity (the defocusing value in example 10) was obtained as not-specified latitude (the depth of focus in example 10) within two specified kinds of latitude (mask-line-width latitude and the exposure latitude) at each measurement point for each of the transfer patterns based on the corrected evaluation pattern and uncorrected evaluation pattern in the same way as in example 1.

Figure 23:
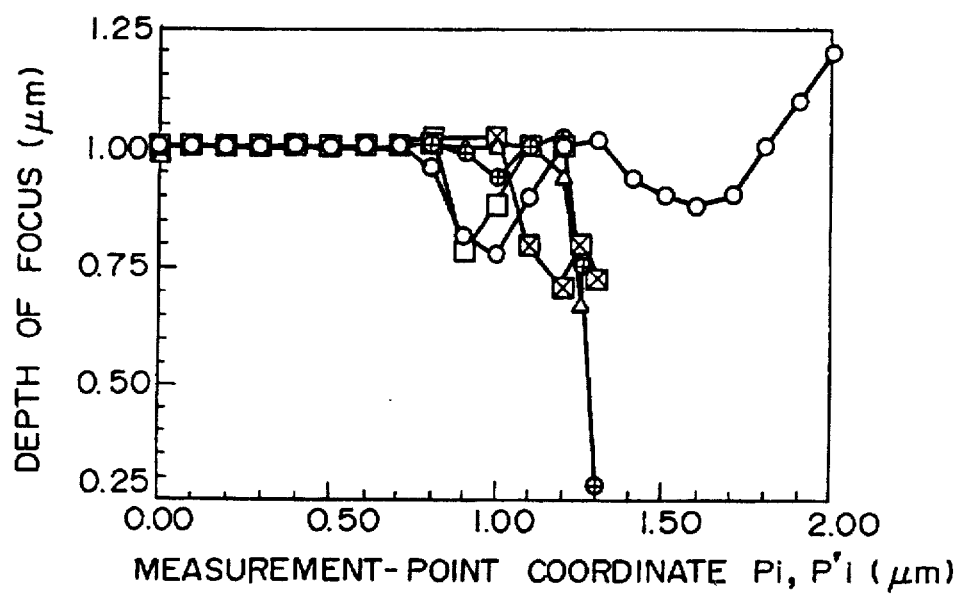
FIG. 23 shows a graph indicating evaluation results for the depth of focus in example 10.

With two kinds of latitude, the mask-line-width latitude and the exposure latitude, being set to ±0.05 μm and ±5.0%, for each evaluation pattern, one latitude which was not specified at each measurement point (the depth of focus in example 10) was expressed as a function of the positions of a series of a multiple of measurement points specified in advance on each evaluation pattern. FIG. 23 shows such functions (five curves) for the depth of focus (unit: μm) with the positions of the measurement points being set along the horizontal axis.

A transfer pattern could not be obtained for the uncorrected evaluation pattern, which did not compensate for the optical proximity effect. Therefore, FIG. 23 shows data only for the corrected evaluation pattern, which compensated for the optical proximity effect. From FIG. 23, it was clear that the optical proximity effect was successfully compensated for in all the evaluation areas in the corrected evaluation pattern.

EXAMPLE 11

Example 11 was a modified example of example 10. The same evaluation patterns as those used in example 10 were used. The exposure condition in example 11 was the same as that used in example 10.

Among three kinds of latitude, mask-line-width latitude, exposure latitude, and the depth of focus, two kinds of latitude, the mask-line-width latitude and the exposure latitude, were set in example 10. In contrast, in example 11, among three kinds of latitude, mask-line-width latitude, exposure latitude, and the depth of focus, two kinds of latitude, the mask-line-width latitude and the depth of focus, were set to ±0.05 μm and ±0.05 μm. The phase-error latitude was set to ±0.0 degrees and ±5.0 degrees.

In example 11, with the widths of the patterns and spaces in the transfer patterns obtained from the line patterns and the spaces in the corrected evaluation pattern and the uncorrected evaluation pattern, the shapes of the patterns formed on a photomask were evaluated.

The mask-line-width latitude and the depth of focus were specified in example 11. With the amount of exposure being changed, the transfer pattern corresponding to each evaluation pattern was obtained by simulation. The amount of exposure changed in the same way as for example 3.

The sizes of portions in the transfer pattern were obtained at the positions corresponding to a plurality of measurement points ($P_0$ to $P_n$ and $P'_0$ to $P'_n$) specified in advance on each of the corrected evaluation pattern and the uncorrected evaluation pattern in the same way as in example 3.

According to the obtained sizes (corresponding to the pattern widths and the space widths) of the transfer patterns, the minimum value of the quantity (the amount of exposure in example 11) was obtained as not-specified latitude (the exposure latitude in example 11) within two specified kinds of latitude (mask-line-width latitude and the depth of focus) at each measurement point for each of the transfer patterns based on the corrected evaluation pattern and uncorrected evaluation pattern in the same way as in example 3.

Figure 24A:
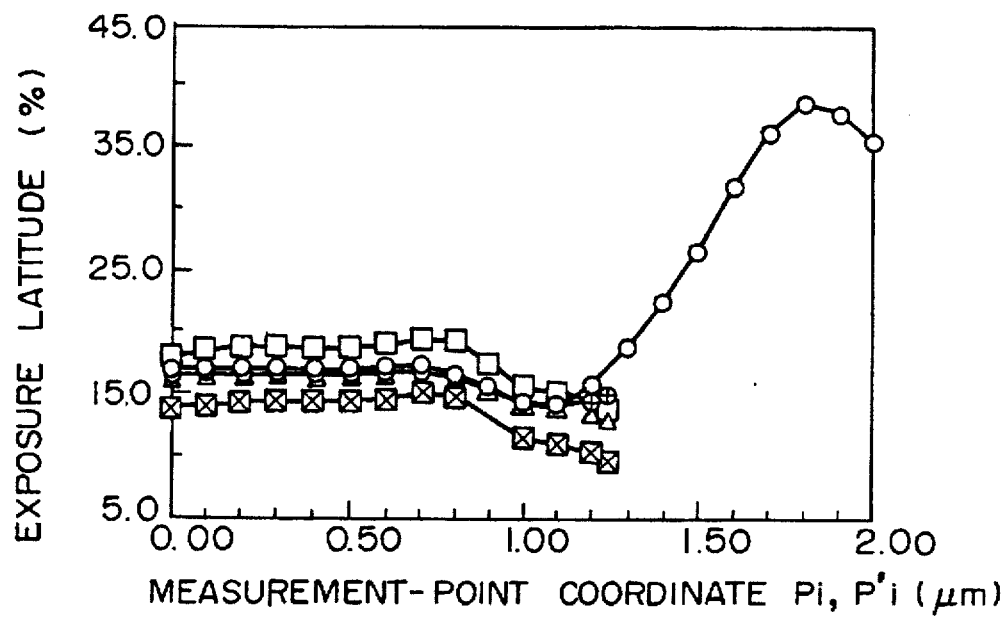
FIGS. 24A and 24B show graphs indicating evaluation results for the exposure latitude in example 11.
Figure 24B:
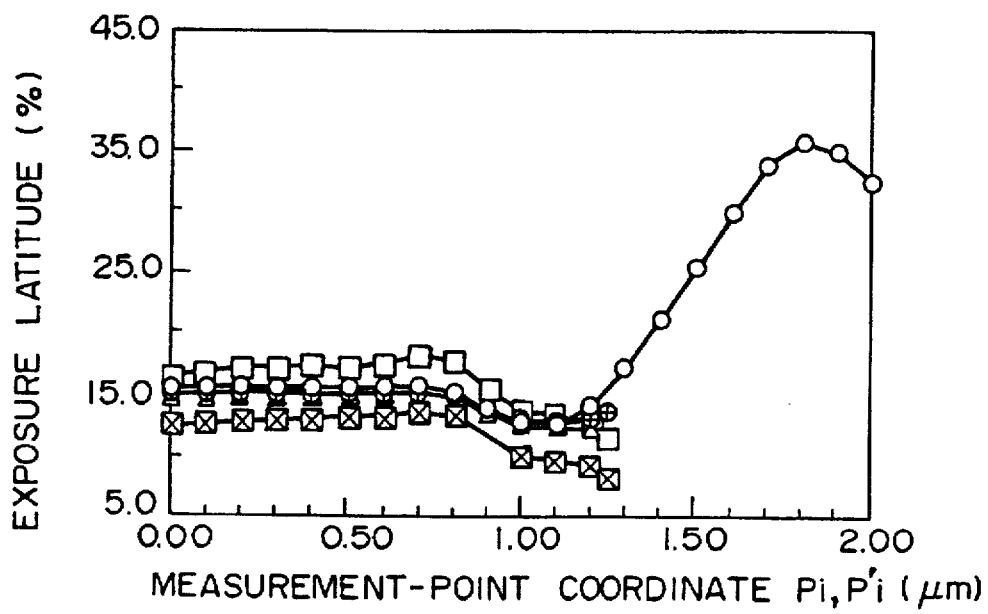
Figure 25:
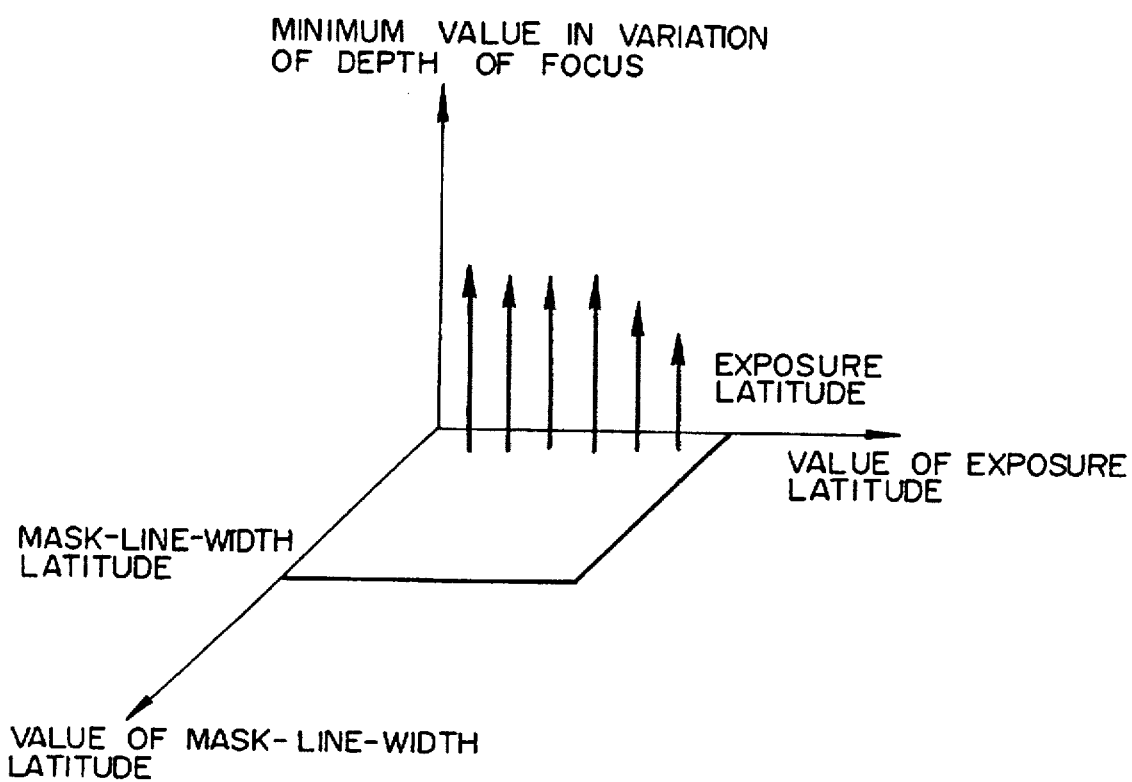
FIG. 25 is a graph typically indicating changes in the minimum value of variation in the defocusing value against the mask-line-width latitude and the exposure latitude.

With two kinds of latitude, the mask-line-width latitude and the depth of focus, being set to ±0.05 μm and ±0.05 μm, for each evaluation pattern, one latitude which was not specified at each measurement point (the exposure latitude in example 11) was expressed as a function of the positions of a series of a multiple of measurement points specified in advance on each evaluation pattern. FIG. 24 shows such functions (five curves) for the exposure latitude (unit: %) with the positions of the measurement points being set along the horizontal axis. FIG. 24A shows the functions with a phase-shift latitude of ±0.0 degrees and FIG. 24B shows the functions with a phase-shift latitude of ±5.0 degrees.

A transfer pattern could not be obtained for the uncorrected evaluation pattern, which did not compensate for the optical proximity effect. Therefore, FIG. 24 shows data only for the corrected evaluation pattern, which compensated for the optical proximity effect. From FIG. 24, it was clear that the optical proximity effect was successfully compensated for in all the evaluation areas in the corrected evaluation pattern.

A photomask manufacturing method or a photomask-pattern forming method according to examples 1 to 9 will be outlined below. A usual photomask having patterns formed with light-transmission areas and opaque areas is taken.

Figure 26:
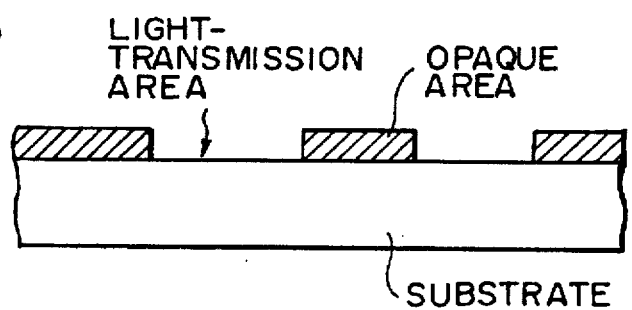
FIG. 26 is a typical, partial cross section of a usual photomask having patterns formed with light-transmission areas and opaque areas.

A substrate made from quartz and transparent to exposure light is prepared and an opaque layer made from Cr is formed on a surface of the substrate in the spatter method or the like. The opaque layer is formed with a thickness such that the resist is not exposed to exposure light and light passing through the opaque area, if any, does not affect light passing thorough a light-transmission area at all. A resist material is applied to the opaque layer, the resist material is patterned in the electronic-line drawing method or the like, and the material is developed. Then, the opaque layer is etched with the resist material being used as an etching mask to form opaque areas. The photomask whose partial cross-section is typically shown in FIG. 26 is manufactured.

Figure 27A:
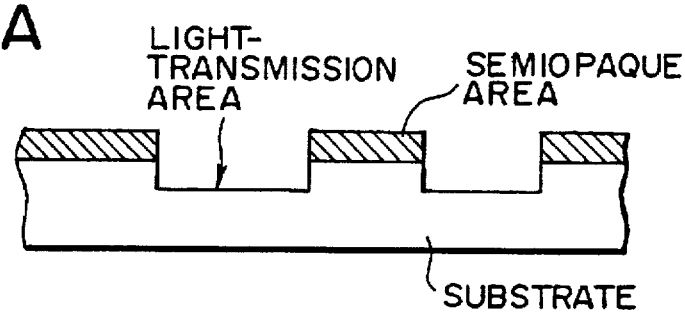
FIGS. 27A to 27D are typical, partial cross sections of half-tone phase-shift photomasks having patterns formed with light-transmission areas and opaque areas.

A photomask manufacturing method or a photomask-pattern forming method according to examples 10 and 11 will be outlined below. A so-called half-tone phase-shift photomask having patterns formed with light-transmission areas and opaque areas is taken. FIGS. 27A, 27B, 27C, and 27D illustrate typical, partial cross-sections of half-tone phase-shift photomasks. The half-tone phase-shift photomask shown in FIG. 27A is of so-called substrate digging type. Light-transmission areas comprise groove-shaped portions digged in the substrate. By forming the groove-shaped portions in the substrate, the phase of light passing through a light-transmission area can be made different from that of light passing through a semiopaque area. In this case, by setting the depth of the groove-shaped portions appropriately, the difference in phase between light passing through a light-transmission area and a semiopaque area is set to 180 degrees. In the half-tone phase-shift photomasks shown in FIGS. 27B and 27C, phase-shift layers are formed under or on semiopaque areas. By setting the widths of phase-shift layers appropriately, the difference in phase between light passing through a light-transmission area and light passing through a semiopaque area is set to, for example, 180 degrees. In the half-tone phase-shift photomask shown in FIG. 27D, semiopaque areas have both a semi-light-shielding function and, for example, a phase-shift function. Also with this configuration, the difference in shift between light passing through a light-transmission area and a semiopaque area is set to, for example, 180 degrees.

The substrate-digging-type, half-tone, phase-shift photomask shown in FIG. 27A can be manufactured in the following manufacturing processes. An opaque layer made from, for example, chrome is formed on a surface of a substrate made from a transparent material such as quartz in the spatter method. A positive resist, for example, is formed on the semiopaque layer in the rotational-application method. An electronic line is emitted onto positive resist disposed on the portions where light-transmission areas are to be formed in, for example, the electronic-line drawing method, and the positive resist is developed. Then, the semiopaque layer, mode from chrome, is dry-etched in plasma of mixed gas of oxygen and chlorine in order to form semiopaque areas. The substrate is etched in plasma of mixed gas of oxygen and carbon tetrafluoride to form light-transmission areas comprising the groove-shaped portions, and the positive resist is removed last. As described above, the half-tone phase-shift photomask shown in FIG. 27A is manufactured.

The half-tone phase-shift photomask shown in FIG. 27B can be manufactured in the following manufacturing processes. A phase-shift layer made from, for example, SOG (spin on glass) is formed on a surface of a substrate made from a transparent material such as quartz in the rotational-application method. With a phase shift caused by a semiopaque area and a phase difference at each layer surface being taken into account, the thickness of the phase-shift layer is determined such that the difference in phase between light passing through a light-transmission area and light passing through a semiopaque area is 180 degrees. Then, a semiopaque layer made from chrome is formed on the phase-shift layer in the spatter method. A positive resist, for example, is formed on the semiopaque layer in the rotational-application method. An electronic line is emitted onto positive resist disposed on the portions where light-transmission areas are to be formed in, for example, the electronic-line drawing method, and the positive resist is developed. Then, the semiopaque layer, made from chrome, is dry-etched in plasma of mixed gas of oxygen and chlorine, and the phase-shift layer, made from SOG, is etched in plasma of mixed gas of oxygen and carbon tetrafluoride to form semiopaque areas. Then, the positive resist is removed last. As described above, the half-tone phase-shift photomask shown in FIG. 27B is manufactured.

Figure 27B:
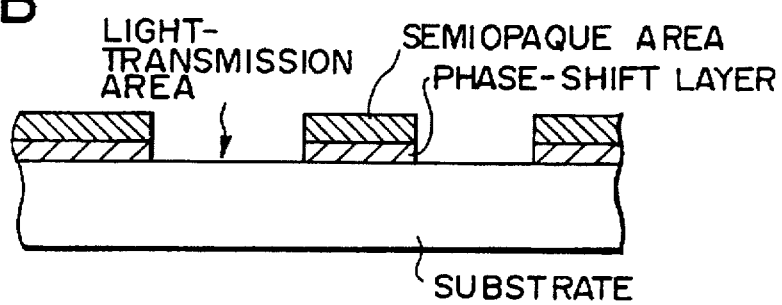
Figure 27C:
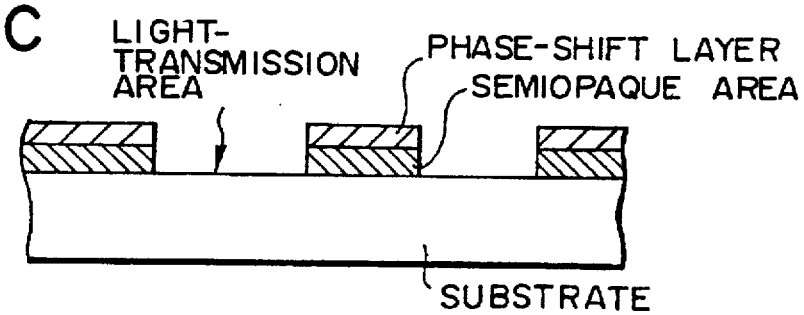

The half-tone phase-shift photomask shown in FIG. 27C can be basically manufactured in the same way as for the half-tone phase-shift photomask shown in FIG. 27B except for the sequence of the manufacturing processes. A semiopaque layer made from chrome is formed on a surface of a substrate made from a transparent material such as quartz in the spatter method. A phase-shift layer made from, for example, SOG is formed on the semiopaque layer in the rotational-application method. A positive resist, for example, is formed on the phase-shift layer in the rotational-application method. An electronic line is emitted onto positive resist disposed on the portions where light-transmission areas are to be formed in, for example, the electronic-line drawing method, and the positive resist is developed. Then, the phase-shift layer, made from SOG, is etched in plasma of mixed gas of oxygen and carbon tetrafluoride, and the semiopaque layer, made from chrome, is dry-etched in plasma of mixed gas of oxygen and chlorine, to form semiopaque areas. Then, the positive resist is removed last. As described above, the half-tone phase-shift photomask shown in FIG. 27C is manufactured.

Figure 27D:
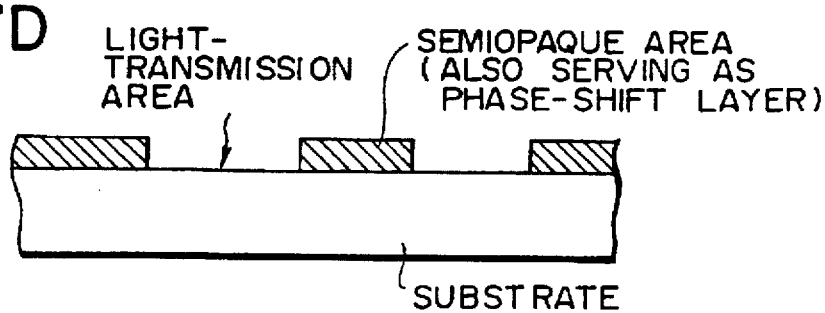

The half-tone phase-shift photomask shown in FIG. 27D can be substantially manufactured in the same way as for the usual photomask described in FIG. 26. Semiopaque areas are formed with a single-layer semiopaque layer formed on a surface of a substrate. A material used for the single-layer semiopaque layer is selected from materials which have the desired amplitude transmission rate or the desired light-intensity transmission rate and which can change the phase. Such material includes SiN, $SiO_xN_y$, $SiO_x$, SiC, $CrO_xN_y$, $MoSiO_xN_y$, C, and $HfO_x$.

In a half-tone phase-shift photomask, the amplitude transmission rate at a semiopaque area is larger than 0 and about a degree where a resist is not resolved, for example, 20% to 45%. This corresponds to a light-intensity transmission rate of about 4% to 20%. With the thickness of a semiopaque area being controlled, the desired amplitude transmission rate or the light-intensity transmission rate is obtained.

Figure 28A:
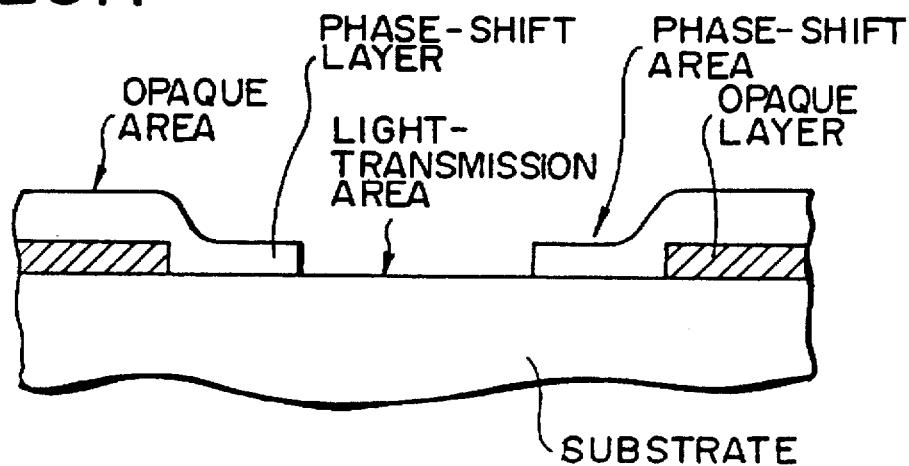
FIGS. 28A to 28C are typical, partial cross sections of phase-shift photomasks having patterns formed with light-transmission areas, semiopaque areas, and phase-shift areas.
Figure 28B:
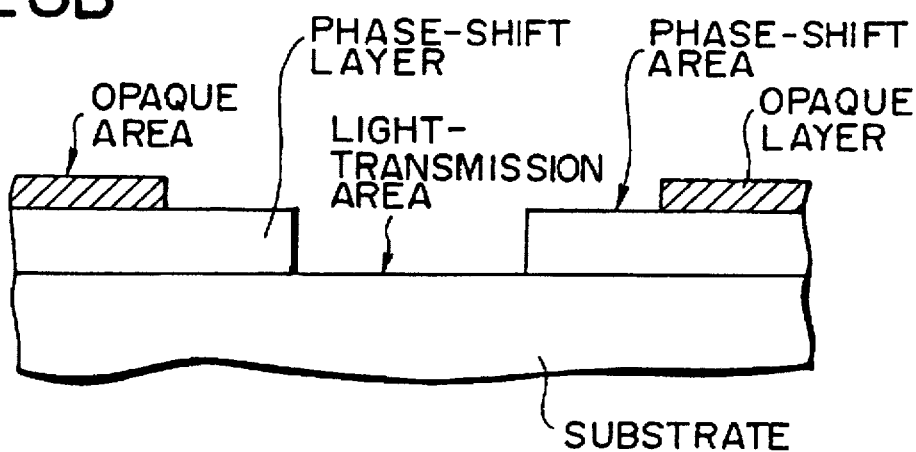
Figure 28C:
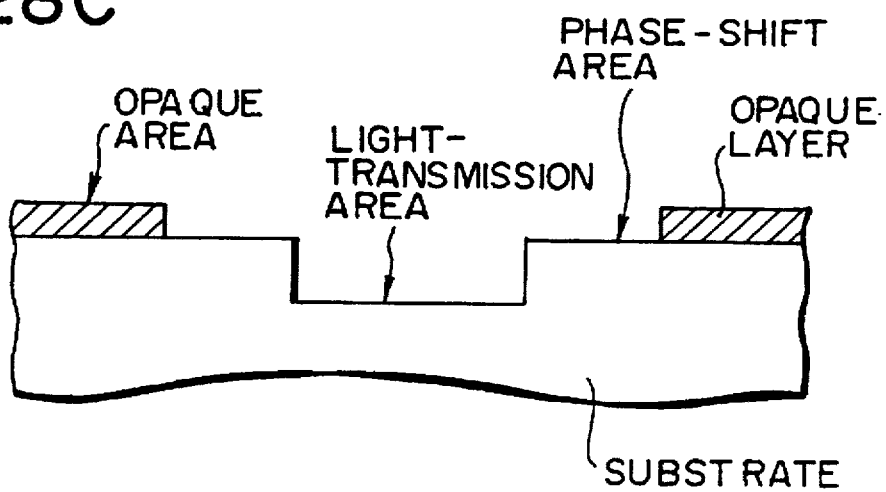
Figure 29A:
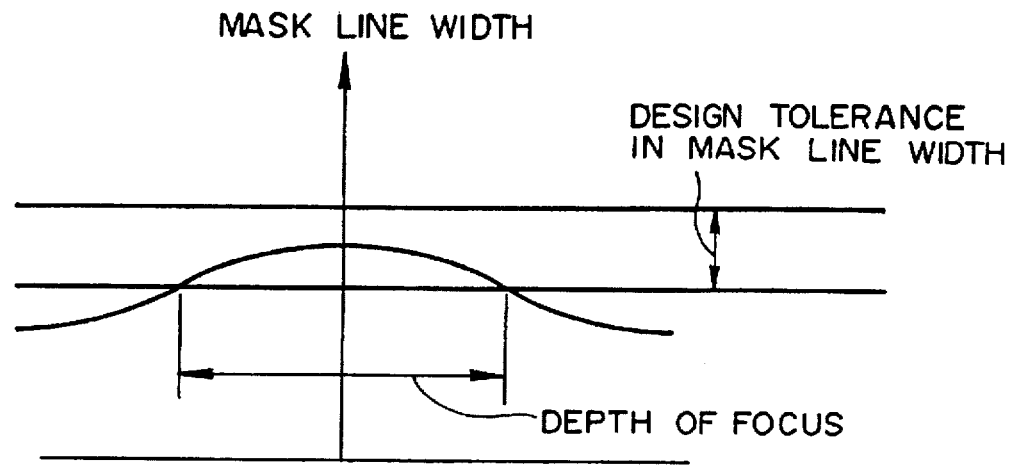
FIGS. 29A and 29B are views used for describing the conventional latitude determination method.
Figure 29B:
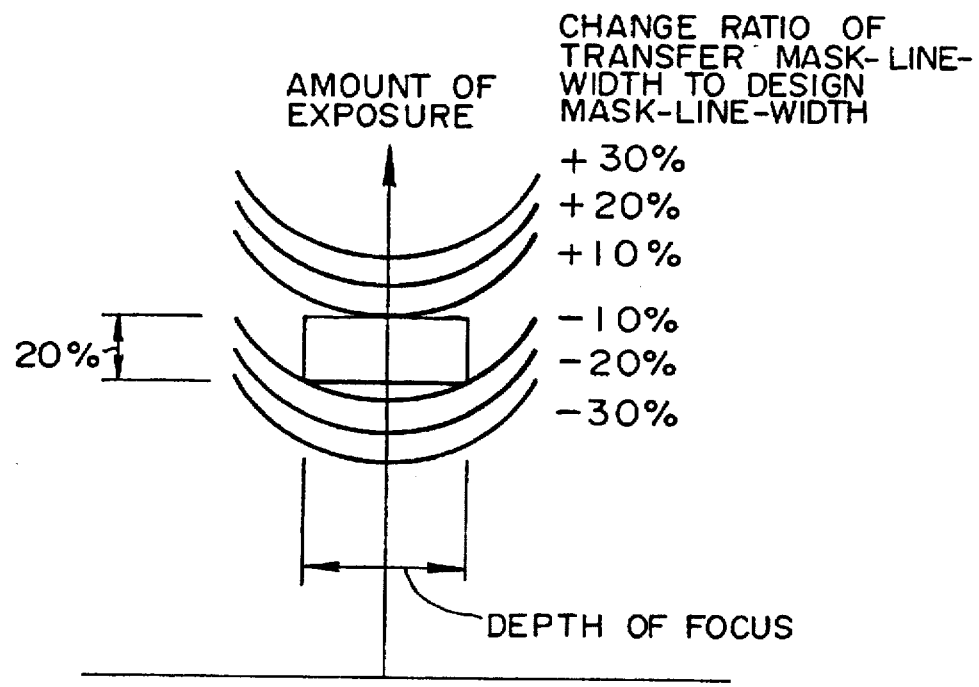

A manufacturing method for a so-called phase-shift photomask having patterns formed with light-transmission areas, opaque areas shielding light, and phase-shift areas made from a phase-shift material where light having a different phase from that of light passing through a light-transmission area passes will be outlined below. FIGS. 28A, 28B, and 28C show typical cross-sections of conventional edge-enhancement phase-shift photomasks. With a phase-shift area being provided, the phase difference between light passing through a light-transmission area and light passing through the phase-shift area is set to, for example, 180 degrees.

The phase-shift area shown in FIG. 28A can be manufactured in the following method. A substrate made from quartz is prepared and an opaque layer made from Cr is formed on a surface of the substrate in the spatter method or the like. The opaque layer is formed with a thickness such that the resist is not exposed to exposure light and light passing through the opaque area, if any, does not affect light passing thorough a light-transmission area at all. A resist material is rotationally applied to the opaque layer, the resist material is patterned in the electronic-line drawing method or the like, and the material is developed. Then, the opaque layer is etched with the resist material being used as an etching mask. A phase-shift material layer is formed on the entire surface. A resist is applied to the phase-shift layer made from the phase-shift material, the resist material is patterned in the electronic-line drawing method or the like, and the material is developed. Then, the phase-shift layer is etched with the resist material being used as an etching mask to form phase-shift areas. The photomask whose partial cross-section is typically shown in FIG. 28A is manufactured. Since the phase-shift photomasks shown in FIGS. 28B and 28C can also be manufactured substantially in the same method, detailed descriptions will be omitted here.

The materials used in the photomask manufacturing processes can be changed as required. The substrate can be made from usual glass or glass to which various components are added, in addition to quartz. The material composing the semiopaque areas may be materials which shield light to some extent, such as chrome, chrome oxide, chrome oxide deposited on chrome, high-melting-point metals (W, Mo, Be, or others), tantalum, aluminum, and metal silicides such as $MoSi_2$. The phase-shift layer may be formed with a transparent material, such as SOG, polymethyl methacrylate, magnesium fluoride, titanium dioxide, polyimide, silicon dioxide, indium oxide, SiN, and various resists.

The present invention has been described according to the preferred embodiments and examples. The invention is not restricted to these embodiments or examples. The conditions and data used in the embodiments and examples are only for examples and can be changed as required.

According to the present invention, since the shape of the transfer pattern obtained from a pattern formed on a photomask in which the optical proximity effect is compensated for can be expressed as a function of the mask-line-width latitude, the exposure latitude, and the depth of focus, improvement in compensating for the optical proximity effect can be conducted with all the actual process latitudes being reflected. Also according to the present invention, a pattern having simple, precise, appropriate corrections against the optical proximity effect can be formed on a photomask under exposure conditions which are not separate from those in an actual lithography process of semiconductor devices. In addition, according to the present invention, a photomask on which a pattern is formed with appropriate corrections against the optical proximity effect, a photomask manufacturing method, a pattern forming method, and an exposure method can be provided.

What is claimed is:

1. A pattern-shape evaluation method for a photomask used in a photolithography process wherein patterns formed on said photomask are transferred onto a photoresist formed on a base member with exposure light to form transfer patterns which are the photomask patterns transferred onto said photoresist, said photomask having patterns formed with light-transmission areas and opaque areas, light-transmission areas and semiopaque areas having a phase shift effect, light-transmission areas and semiopaque areas not having the phase shift effect, or light-transmission areas, opaque areas and phase-shift areas, said pattern-shape evaluation method comprising the steps of:

specifying a plurality of evaluation patterns to be formed on said photomask and specifying two of three kinds of latitude, mask-line-width latitude, exposure latitude, and depth of focus;

obtaining the transfer pattern corresponding to each of said evaluation patterns with a defocusing value being changed as a changing quantity when said photomask-line-width latitude and said exposure latitude are specified, with the amount of exposure being changed as a changing quantity when said mask-line-width latitude and the depth of focus are specified, or with the mask line width of said evaluation patterns being changed as a changing quantity when said exposure latitude and the depth of focus are specified;

obtaining sizes of portions on said transfer pattern at the positions on said transfer pattern corresponding to a plurality of measurement points specified in advance on each of said evaluation patterns; and obtaining a minimum value of said changing quantity as one not-specified latitude within the two kinds of latitude specified for each of said evaluation patterns according to the obtained sizes of said transfer pattern and comparing the obtained latitude for each of said evaluation patterns.

2. A pattern-shape evaluation method according to claim 1, wherein one not-specified latitude for each of said evaluation patterns is expressed as a function of the positions of a series of a plurality of measurement points specified in advance on each of said evaluation patterns and the magnitude of the latitude is compared by the whole function.

3. A photomask manufacturing method for a photomask used in a photolithography process wherein patterns formed on said photomask are transferred onto a photoresist formed on a base member with the use of exposure light to form a transfer pattern which is the photomask pattern transferred onto said photoresist, said photomask having patterns formed with light-transmission areas and opaque areas, light-transmission areas and semiopaque areas having the phase shift effect, light-transmission areas and semiopaque areas not having the phase shift effect, or light-transmission areas, opaque areas and phase-shift areas, said photomask manufacturing method comprising the steps of:

specifying a plurality of evaluation patterns to be formed on said photomask and specifying two of three kinds of latitude, mask-line-width latitude, exposure latitude, and the depth of focus;

obtaining the transfer pattern corresponding to each of said evaluation patterns with a defocusing value being changed as a changing quantity when said mask-line-width latitude and said exposure latitude are specified, with the amount of exposure being changed as a changing quantity when said mask-line-width latitude and the depth of focus are specified, or with the mask line width of said evaluation patterns being changed as a changing quantity when said exposure latitude and the depth of focus are specified;

obtaining the sizes of portions on said transfer pattern at positions on said transfer pattern corresponding to a plurality of measurement points specified in advance on each of said evaluation patterns;

obtaining a minimum value of said changing quantity as one not-specified latitude within said two kinds of latitude specified for each of said evaluation patterns according to the obtained sizes of said transfer pattern; and comparing each of the obtained latitude for each evaluation pattern specified and forming the evaluation pattern having the largest of one not-specified latitude among said evaluation patterns on said photomask.

4. A photomask manufacturing method according to claim 3, wherein one not-specified latitude for each of said evaluation patterns is expressed as a function of the positions of a series of a plurality of measurement points specified in advance on each of said evaluation patterns and the magnitude of the latitude is compared by the whole function.

5. A pattern forming method for patterns used in a photolithography process wherein patterns formed on a photomask are transferred onto a photoresist formed on a base member with the use of exposure light to form a transfer pattern which is the photomask pattern transferred onto said photoresist, said patterns being formed with light-transmission areas and opaque areas, light-transmission areas and semiopaque areas having the phase shift effect, light-transmission areas and semiopaque areas not having the phase shift effect, or light-transmission areas, opaque areas and phase-shift areas, said pattern forming method comprising the steps of:

specifying a plurality of evaluation patterns to be formed on said photomask and specifying two of three kinds of latitude, mask-line-width latitude, exposure latitude, and the depth of focus;

obtaining a transfer pattern corresponding to each of said evaluation patterns with a defocusing value being changed as a changing quantity when said mask-line-width latitude and said exposure latitude are specified, with the amount of exposure being changed as a changing quantity when said mask-line-width latitude and the depth of focus are specified, or with the mask line width of said evaluation patterns being changed as a changing quantity when said exposure latitude and the depth of focus are specified;

obtaining sizes of portions on said transfer pattern at positions on said transfer pattern corresponding to a plurality of measurement points specified in advance on each of said evaluation patterns;

obtaining a minimum value of said changing quantity as one not-specified latitude within said two kinds of latitude specified for each of said evaluation patterns according to the obtained sizes of said transfer pattern; and comparing each of the obtained latitude for each evaluation pattern specified and forming the evaluation pattern having the largest of one not-specified latitude among said evaluation patterns on said photomask.

6. A pattern forming method according to claim 5, wherein one not-specified latitude for each of said evaluation patterns is expressed as a function of the positions of a series of a plurality of measurement points specified in advance on each of said evaluation patterns and the magnitude of the latitude is compared by the whole function.

7. An exposure method for forming a transfer pattern on a photoresist by transferring patterns from a photomask onto said photoresist formed on a base member, said photomask having patterns formed with light-transmission areas and opaque areas, light-transmission areas and semiopaque areas having the phase shift effect, light-transmission areas and semiopaque areas not having the phase shift effect, or light-transmission areas, opaque areas and phase-shift areas, said exposure method using said photomask manufactured in a process comprising the steps of:

specifying a plurality of evaluation patterns to be formed on said photomask and specifying two of three kinds of latitude, mask-line-width latitude, exposure latitude, and the depth of focus;

obtaining the transfer pattern corresponding to each of said evaluation patterns with a defocusing value being changed as a changing quantity when said mask-line-width latitude and said exposure latitude are specified with the amount of exposure being changed as a changing quantity when said mask-line-width latitude and the depth of focus are specified, or with the mask line width of said evaluation patterns being changed as a changing quantity when said exposure latitude and the depth of focus are specified;

obtaining sizes of portions on said transfer pattern at positions on said transfer pattern corresponding to a plurality of measurement points specified in advance on each of said evaluation patterns;

obtaining a minimum value of said changing quantity as one not-specified latitude within said two kinds of latitude specified for each of said evaluation patterns according to the obtained sizes of said transfer pattern; and comparing each of the obtained latitude for each evaluation pattern specified and forming the evaluation pattern having the largest of one not-specified latitude among said evaluation patterns on said photomask.

8. An exposure method according to claim 7, wherein one not-specified latitude for each of said evaluation patterns is expressed as a function of the positions of a series of a plurality of measurement points specified in advance on each of said evaluation patterns and the magnitude of the latitude is compared by the whole function.

* * * * *